United States Patent
Takemoto et al.

(10) Patent No.: US 11,456,812 B2
(45) Date of Patent: Sep. 27, 2022

(54) DEMULTIPLEXING CIRCUIT, MULTIPLEXING CIRCUIT, AND CHANNELIZER RELAY UNIT

(71) Applicant: MITSUBISHI ELECTRIC CORPORATION, Chiyoda-ku (JP)

(72) Inventors: Yuta Takemoto, Chiyoda-ku (JP); Akinori Fujimura, Chiyoda-ku (JP); Yuichi Yamamoto, Chiyoda-ku (JP)

(73) Assignee: MITSUBISHI ELECTRIC CORPORATION, Chiyoda-ku (JP)

( * ) Notice: Subject to any disclaimer, the term of this patent is extended or adjusted under 35 U.S.C. 154(b) by 431 days.

(21) Appl. No.: 16/490,155

(22) PCT Filed: Mar. 5, 2018

(86) PCT No.: PCT/JP2018/008347
§ 371 (c)(1),
(2) Date: Aug. 30, 2019

(87) PCT Pub. No.: WO2018/164060
PCT Pub. Date: Sep. 13, 2018

(65) Prior Publication Data
US 2021/0409141 A1    Dec. 30, 2021

(30) Foreign Application Priority Data
Mar. 6, 2017    (JP) ............................. JP2017-041668

(51) Int. Cl.
*H04J 4/00*    (2006.01)
*H03H 17/02*    (2006.01)
(Continued)

(52) U.S. Cl.
CPC ......... *H04J 4/005* (2013.01); *H03H 17/0202* (2013.01); *H04B 7/18508* (2013.01); *H04J 1/05* (2013.01)

(58) Field of Classification Search
CPC ........ H04J 4/005; H04J 1/05; H03H 17/0202; H04B 7/18508
(Continued)

(56) References Cited

U.S. PATENT DOCUMENTS 6,714,529 B1 * 3/2004 Tanabe .................. G01L 3/1478
370/343
2005/0013615 A1    1/2005 Matsuda
(Continued)

FOREIGN PATENT DOCUMENTS

JP    2738385 B2    4/1998
JP    2004-364027 A    12/2004
(Continued)

OTHER PUBLICATIONS

Yamashita, F. et al. "A Proposal of Onboard Bandwidth-variable FFT Filter Banks and its Fundamental Characteristics", The Transactions of the Institute of Electronics, Information and Communication Engineers B, vol. J85-B, No. 12, Dec. 2002, pp. 2290-2299.
(Continued)

*Primary Examiner* — Gregory B Sefcheck
*Assistant Examiner* — Majid Esmaeilian
(74) *Attorney, Agent, or Firm* — Oblon, McClelland, Maier & Neustadt, L.L.P.

(57) ABSTRACT

A multi-stage demultiplexing circuit in which a plurality of circuits each combining a selector and a frequency decimation circuit are connected is included. The selector selects one of input signals based on a control signal, and generates a plurality of output signals. The plurality of output signals output from the selector are input to the frequency decimation circuit, and the frequency decimation circuit performs frequency conversion processing, low pass filter processing, and down-sampling processing based on a control signal to generate an output signal. Two or more reception signals are
(Continued)

WHEN TRAFFIC OF #1 IS HEAVY

WHEN TRAFFIC OF #2 IS HEAVY input to the multi-stage demultiplexing circuit, and the multi-stage demultiplexing circuit executes demultiplexing processing based on a control signal so that an output signal that includes an unused band portion is prevented from being output downstream.

17 Claims, 12 Drawing Sheets

(51) Int. Cl.
  *H04B 7/185* (2006.01)
  *H04J 1/05* (2006.01)
(58) Field of Classification Search
  USPC .......................................................... 370/307
  See application file for complete search history.

(56) References Cited

U.S. PATENT DOCUMENTS

| | | | |
|---|---|---|---|
| 2006/0247909 A1* | 11/2006 | Desai | G06F 30/331 703/23 |
| 2009/0185804 A1* | 7/2009 | Kai | H04J 14/0247 398/48 |
| 2009/0260829 A1* | 10/2009 | Mathis | E21B 33/0355 166/336 |
| 2011/0222467 A1 | 9/2011 | Fujimura et al. | |
| 2011/0292940 A1* | 12/2011 | Okamoto | H04L 45/50 370/392 |
| 2013/0155941 A1 | 6/2013 | Fujimura | |
| 2013/0322809 A1* | 12/2013 | Goh | H04B 10/5161 385/3 |
| 2019/0245642 A1* | 8/2019 | Akiyama | H04J 14/0209 |

FOREIGN PATENT DOCUMENTS

| | | |
|---|---|---|
| JP | 5575149 B2 | 8/2014 |
| JP | 5579273 B2 | 8/2014 |
| WO | WO 2010/064485 A1 | 6/2010 |
| WO | WO 2012/026417 A1 | 3/2012 |

OTHER PUBLICATIONS

International Search Report dated Apr. 10, 2018 in PCT/JP2018/008347 filed on Mar. 5, 2018.

* cited by examiner

FIG. 1A
FIG. 1B
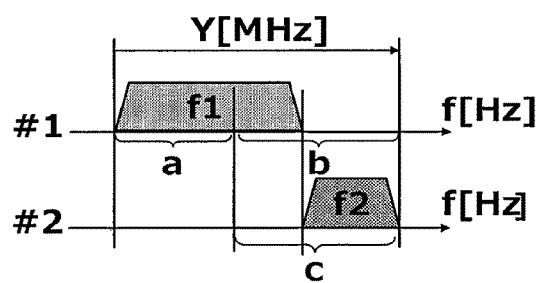
WHEN TRAFFIC OF #1 IS HEAVY
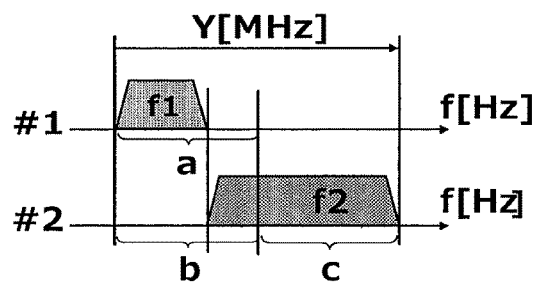
WHEN TRAFFIC OF #2 IS HEAVY

DEMULTIPLEXING CIRCUIT, MULTIPLEXING CIRCUIT, AND CHANNELIZER RELAY UNIT

TECHNICAL FIELD

The present invention relates to a demultiplexing circuit and multiplexing circuit of a communications satellite, and a channelizer relay unit using the demultiplexing circuit and the multiplexing circuit. The present invention more particularly relates to a technology concerning a demultiplexing circuit, multiplexing circuit, and channelizer relay unit for changing the allocation of a signal bandwidth without stopping relaying communication.

BACKGROUND ART

A multi-rate digital multiplexing device and multi-rate digital demultiplexing device of the related art are capable of performing digital multiplexing and digital demultiplexing, respectively, on signals in various bandwidths by combining a sub-filter with a Fourier transform (or fast Fourier transform: FTF) circuit (see Patent Literature 1 and Non Patent Literature 1, for example).

According to the related art, the Fourier transform (or fast Fourier transform) circuit executes processing over the entire system band. The circuit is therefore prohibited by its operation principle to operate only partially even when a band in which demultiplexing/multiplexing processing is to be executed is only a part of the entire system band. The resultant problem is the inability to decrease the circuit scale despite the fact that the band in which demultiplexing/multiplexing processing is to be executed is only a part of the entire system band.

Meanwhile, another related art in this field deals with a decrease in circuit scale (see Patent Literature 2 and Patent Literature 3, for example). Patent Literature 2 is a technology based on a tree-circuit configuration of Patent Literature 3, which uses a half-band filter. Patent Literature 2 addresses the problem of Patent Literature 1 by processing all signals from a plurality of areas that use a part of the entire system band with a single tree circuit, and thus decreasing the circuit scale.

A demultiplexing signal selection/distribution unit used in the process of digital demultiplexing processing of Patent Literature 2 includes a configuration for adjusting the amount of frequency offset and setting a selector. With this configuration, processing of receiving signals from a plurality of areas and supplying the signals to the tree circuit in the downstream is executed in Patent Literature 2.

Similarly, a multiplexing signal selection/distribution unit used in the process of digital multiplexing processing of Patent Literature 2 includes a configuration for adjusting the amount of frequency offset and setting a selector with respect to a signal supplied from a tree circuit in the upstream. With this configuration, processing of transmitting signals to a plurality of areas at once is executed in Patent Literature 2.

CITATION LIST

Patent Literature

[PTL 1] JP 2738385 B2
[PTL 2] JP 5579273 B2
[PTL 3] JP 5575149 B2

Non Patent Literature

[NPL 1] Yamashita Fumihiro, Kazama Hiroshi, Nakasuga Yoshinori, "A Proposal of Onboard Bandwidth-variable FFT Filter Banks and its Fundamental Characteristics", The Transactions of the Institute of Electronics, Information and Communication Engineers B, Vol. J85-B, No. 12, pp. 2290-2299, December, 2002

SUMMARY OF INVENTION

Technical Problem

The related art, however, has the following problem:

A case is considered in which the technology of Patent Literature 2 is applied and a signal bandwidth allocated to a specific area is to be changed in response to a change in required traffic that occurs during operation. In this case, the amount of frequency offset and a selector are required to be re-set for all signals in a target area after communication relayed by a relay device of Patent Literature 2 is stopped between each ground satellite terminal and a gateway station, or between ground satellite terminals.

If a band change is executed by re-setting the amount of frequency offset and a selector while communication is continued between each ground satellite terminal and a gate station or between ground satellite terminals, phase fluctuations and the like occur in relayed communication waves. A possible consequence is an adverse effect on communication quality in the form of brief disconnection or other forms.

When the technology of Patent Literature 2 is applied, the relaying of communication is thus required to be stopped each time the signal bandwidth is changed frequently in order to deal with a change in required traffic in real time. The technology of Patent Literature 2, though capable of decreasing the circuit scale, has a problem in that the communication interruption poses an obstacle to operation.

The present invention has been made to solve this problem, and an object of the present invention is therefore to provide a demultiplexing circuit, multiplexing circuit, and channelizer relay unit capable of changing band allocation in response to a change in required traffic in real time, as well as decreasing the circuit scale.

Solution to Problem

According to one embodiment of the present invention, there is provided a demultiplexing circuit, which is capable of demultiplexing a reception signal into a plurality of signals, the demultiplexing circuit including a multi-stage demultiplexing circuit in which circuits each combining a selector and a frequency decimation circuit are connected in a plurality of stages in a tree format, the selector being configured to select one of input signals based on a signal output destination that is specified by a control signal, and generate a plurality of output signals as many as an output signal number, which is greater than the number of input signals, the frequency decimation circuit, to which the plurality of output signals output from the selector are to be input, being configured to perform frequency conversion processing, low pass filter processing, and down-sampling processing on each of the signals input to the frequency decimation circuit, based on the signal output destination that is specified by the control signal and on a signal bandwidth, to generate an output signal, wherein two or more reception signals are input to the multi-stage demultiplexing circuit, and the multi-stage demultiplexing circuit is configured to execute demultiplexing processing based on the control signal so that an output signal that includes an unused band portion is prevented from being output downstream.

Further, according to one embodiment of the present invention, there is provided a multiplexing circuit, which is configured to multiplex a plurality of input signals, the multiplexing circuit including a multi-stage multiplexing circuit in which circuits each combining a frequency interpolation circuit, a selector, and an adder circuit are connected in a plurality of stages in a tournament format, the frequency interpolation circuit being configured to generate an output signal by performing up-sampling processing, low pass filter processing, and frequency conversion processing on an input signal based on a signal output destination that is specified by a control signal and on a signal bandwidth, the selector, to which the output signal from each of a plurality of frequency interpolation circuits is to be input, being configured to generate an output signal destined to one or more output destinations for each input, based on the signal output destination that is specified by the control signal, the adder circuit being configured to perform addition processing on two desired output signals in adjacent bands out of a plurality of output signals from the selector, wherein a plurality of pre-multiplexing signals each including, at least partially, a used band are input to the multi-stage multiplexing circuit, and the multi-stage multiplexing circuit is configured to execute multiplexing processing based on the control signal so that an unused band portion is added downstream.

Further, according to one embodiment of the present invention, there is provided a channelizer relay unit including: the demultiplexing circuit of one embodiment of the present invention; the multiplexing circuit of one embodiment of the present invention; and a control unit configured to execute processing of changing an allocated band by outputting the control signal to each of the demultiplexing circuit and the multiplexing circuit.

Advantageous Effects of Invention

One embodiment of the present invention includes the configuration for executing the demultiplexing processing based on the control signal in the multi-stage multiplexing circuit in which the selectors and the frequency decimation circuits are connected in a plurality of stages in a tree format, or the configuration for executing the multiplexing processing based on the control signal in the multi-stage multiplexing circuit in which the frequency interpolation circuits, the selectors, and the adder circuits are connected in a plurality of stages in a tournament format.

As a result, it is possible to provide the demultiplexing circuit, multiplexing circuit, and channelizer relay unit capable of changing band allocation in response to a change in required traffic in real time, as well as decreasing the circuit scale.

BRIEF DESCRIPTION OF DRAWINGS

FIG. 1 are each a diagram for illustrating an example of frequency allocation of two adjacent beam areas in a first embodiment of the present invention.

DESCRIPTION OF EMBODIMENTS

Now, with reference to the drawings, a description is given of a demultiplexing circuit, a multiplexing circuit, and a channelizer relay unit according to preferred embodiments of the present invention.

First Embodiment

FIG. 1 are each a diagram for illustrating an example of frequency allocation of two adjacent beam areas #1 and #2 in a first embodiment of the present invention. In FIG. 1, a frequency allocation range of the beam area #1 is denoted by f1, and a frequency allocation range of the beam area #2 is denoted by f2.

The adjacent beam areas #1 and #2 generally use different frequencies in order to avoid interference. FIG. 1A is a diagram for illustrating a case in which the beam area #1 is heavy in required traffic, and FIG. 1B is a diagram for illustrating a case in which the beam area #2 is heavy in required traffic. In both cases, the concurrent use of the same frequency in the two adjacent beam areas is avoided.

The sum of f1 and f2 is no wider than a frequency bandwidth Y (MHz) allocated to a user. The combined bandwidth of f1 and f2 in this example is Y (MHz).

In the present invention, attention is paid to the fact that there is no frequency overlap between adjacent beam areas. A first technical feature of the present invention is that a decrease in the overall circuit scale and power consumption of a user link-side channelizer is accomplished by simultaneously processing the band f1, which is used in the beam area #1, and the band f2, which is used in the beam area #2, with a single demultiplexing circuit or multiplexing circuit.

It can be said that the first technical feature is shared with Patent Literature 2. However, the present invention also has a second technical feature in that band allocation can be changed in real time in response to a change in required traffic. The second technical feature is a feature unique to the present invention that cannot be achieved with Patent Literature 2, and is described in detail below.

[Channelizer Downsizing Effect and Power Consumption Reduction Effect]

Figure 2:
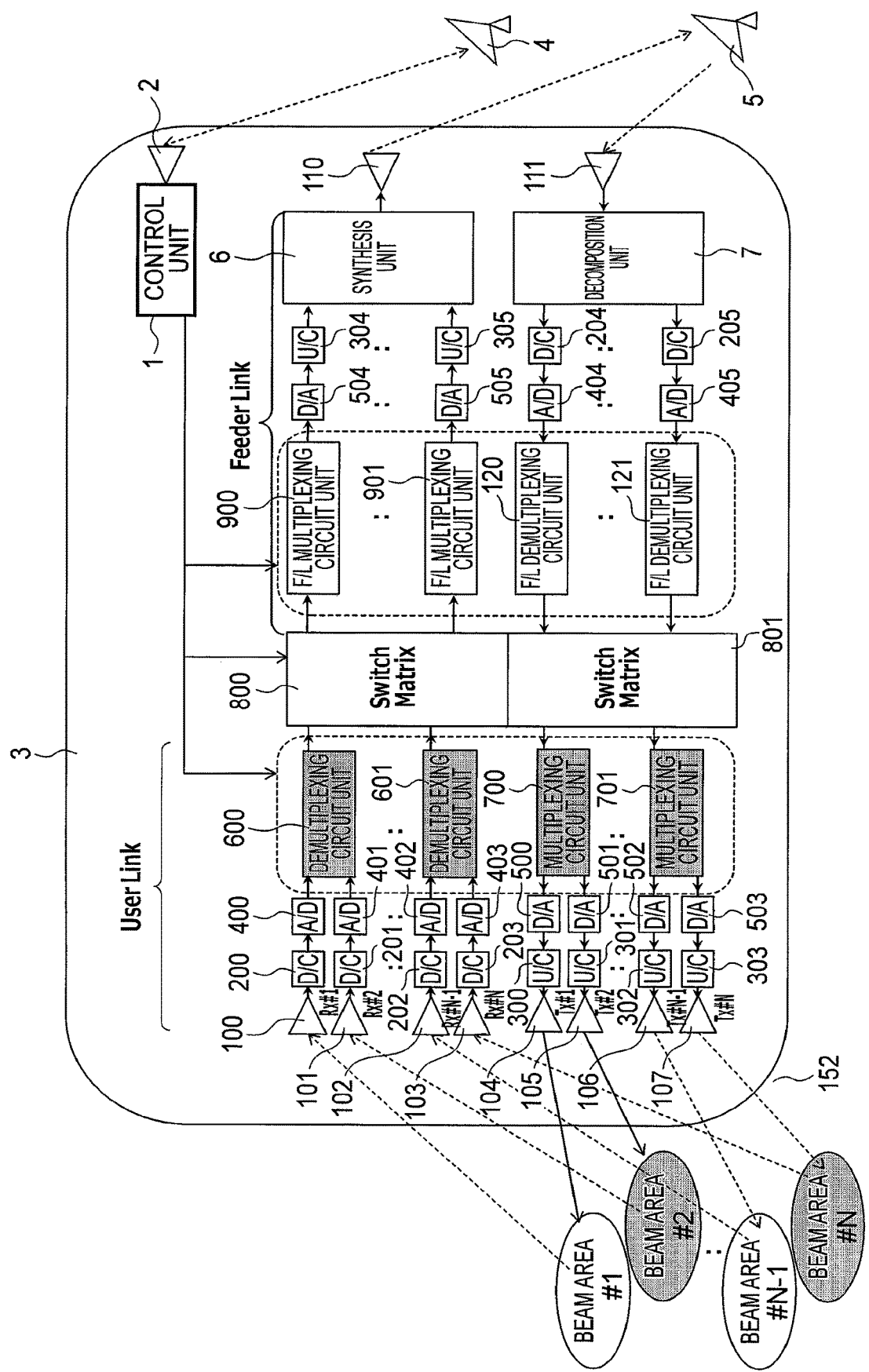
FIG. 2 is a diagram for illustrating a configuration example of a channelizer relay unit that uses a demultiplexing circuit and multiplexing circuit according to the first embodiment of the present invention.

How the use of the present invention provides an effect of reducing the circuit scale and power consumption of the user link-side channelizer is described first with reference to FIG. 2.

FIG. 2 is a diagram for illustrating a configuration example of a channelizer relay unit that uses a demultiplexing circuit (600, 601 in FIG. 2) and a multiplexing circuit (700, 701 in FIG. 2) according to the first embodiment of the present invention.

The user link side is described first.

At Rx#1 to Rx#N in FIG. 2, analog signals from the ground are received by reception antennas 100, 101, 102, and 103. Frequency conversion is performed on the received analog signals by down-converters (D/C) 200, 201, 202, and 203. The analog signals converted by down-conversion are further converted into digital signals with the use of AD converters (A/D) 400, 401, 402, and 403.

The digital signals obtained by the conversion are demultiplexed for each sub-channel by demultiplexing circuit units 600 and 601, and the sub-channels of the demultiplexed signals are switched in a switch matrix 800 or 801.

A signal received by the reception antenna 100 is a signal from the beam area #1, and a signal received by the reception antenna 101 is a signal from the beam area #2. The two beam areas (#1 and #2) are adjacent to each other, and different frequency bands are thus allocated to a signal from the beam area #1 and a signal from the beam area #2 as illustrated in FIG. 1 in order to avoid interference.

Similarly, a signal received by the reception antenna 102 is a signal from the beam area #N−1, and a signal received by the reception antenna 103 is a signal from the beam area #N. The two beam areas (#N−1 and #N) are adjacent to each other, and different frequency bands are thus allocated to a signal from the beam area #N−1 and a signal from the beam area #N as illustrated in FIG. 1 in order to avoid interference.

The switch matrix 800 or 801 distributes input sub-channels to antennas 104, 105, 106, and 107 at Tx#1 to Tx#N. The distributed sub-channels are multiplexed in multiplexing circuit units 700 and 701.

The multiplexed data is converted into analog signals with the use of DA converters (D/A) 500, 501, 502, and 503. The analog signals obtained by the conversion are converted by up-converters (U/C) 300, 301, 302, and 303 to have transmission frequencies, and are transmitted to the ground from the antennas 104, 105, 106, and 107.

The feeder link side is described next.

Signals from the switch matrix 800 or 801 are multiplexed by feeder link (F/L) multiplexing circuit units 900 and 901, and the multiplexed data is converted into analog signals with the use of DA (D/A) converters 504 and 505.

The analog signals obtained by the conversion are converted by a U/C 304 and a U/C 305 to have transmission frequencies. A synthesis unit 6 then synthesizes a plurality of signals. The synthesized signal is transmitted to the ground from a feeder link antenna 110, and is received by a feeder link ground station 5.

A control unit 1 receives a command from a control station 4 on the ground via a reception antenna 2. Based on the received command, the control unit 1 outputs control signals to the switch matrices 800 and 801, the demultiplexing circuit units 600 and 601, the multiplexing circuit units 700 and 701, the F/L multiplexing circuit units 900 and 901, and F/L demultiplexing circuit units 120 and 121 so that desired frequency allocation is accomplished.

The control station 4 on the ground keeps track of the connection situation of a satellite communication network, for example, call requests and talk states of satellite communication terminals present in the beam areas. The control station 4 accordingly changes the allocation of a frequency used in each beam area to suit the traffic situation, and issues a settings change command for executing relay under the new frequency allocation arrangement to the control unit 1.

The control unit 1 sets settings based on the settings change command received from the control station 4 to the switch matrices 800 and 801, the demultiplexing circuit units 600 and 601, the multiplexing circuit units 700 and 701, the F/L multiplexing circuit units 900 and 901, and the F/L demultiplexing circuit units 120 and 121.

The same line as a telemetry/command line of a satellite, for example, may be used for communication between the control unit 1 and the control station 4 on the ground.

When the related art of Patent Literature 1 is used, the demultiplexing circuit units 600 and 601 on the user link side are required to be a demultiplexing circuit unit provided for each beam area, and N demultiplexing circuits units are required in the example of FIG. 2. Similarly, the multiplexing circuit units 900 and 901 are required to be a multiplexing circuit unit provided for each beam area when the related art of Patent Literature 1 is used, and N multiplexing circuit units are required in the example of FIG. 2.

When the technology of the first embodiment is used, on the other hand, each demultiplexing circuit/multiplexing circuit is capable of processing signals of two beam areas, and the channelizer relay unit can be configured from only N/2 demultiplexing circuits (600 and 601) and N/2 multiplexing circuits (700 and 701) as illustrated in FIG. 2. This means that, compared to the case of using the related art of Patent Literature 1, the scale and power consumption of demultiplexing/multiplexing circuits on the user link side (=beam areas) are approximately halved.

In addition, demultiplexing/multiplexing processing is executed basically for the bandwidth Y (MHz) allocated to the user when the related art of Patent Literature 1 is used. For instance, as illustrated in FIG. 1, demultiplexing/multiplexing processing of each beam area is executed also for an unused band (a blank portion excluding f1 or f2) in the bandwidth Y (MHz) that is not allocated to the beam area.

Information of Y (MHz) including a signal in the unused band is consequently input from each single demultiplexing circuit to the switch matrix 800 in the downstream of the demultiplexing circuit. The related art of Patent Literature 1 accordingly requires the switch matrix 800 to process a signal band of N×Y (MHz) in total in the case of FIG. 2.

In contrast, the use of the demultiplexing circuit according to the first embodiment enables the channelizer relay unit to extract only a band required for relaying from two beams of signal bands. This means that signals of Y (MHz) for two beams, that is, signals of approximately 0.5 (MHz) per beam, are input to the switch matrix 800 in the downstream of the demultiplexing circuit. The band of the input signals approaches 0.5 (MHz) per beam when the number of demultiplexed frequencies is infinite. In the following description, however, "approximately 0.5Y" is simply written as "0.5Y".

The switch matrix 800 is accordingly required to process a signal band of only N×0.5Y (MHz) in the case of FIG. 2. As a result, the use of the demultiplexing circuit according to the first embodiment halves the band to be processed by the switch matrix 800 compared to when a demultiplexing circuit of Patent Literature 1 is used.

Similarly, the multiplexing circuit according to the first embodiment requires the switch matrix unit 801 in the upstream of the multiplexing circuit to output signals of only Y (MHz) for two beams to a single multiplexing circuit. The switch matrix unit 801 is accordingly required to handle a signal band of only N×0.5Y (MHz) in total. The band to be processed by the switch matrix unit 801 is consequently halved as well by the use of the multiplexing circuit according to the first embodiment, compared to when a multiplexing circuit of Patent Literature 1 is used.

In short, the use of the demultiplexing circuit and multiplexing circuit according to the first embodiment halves not only the overall circuit scale and power consumption of the user link-side demultiplexing circuit and multiplexing circuit, but also halves the circuit scale and power consumption of each switch matrix unit on the user link side.

[Details of the Demultiplexing Circuit According to the Present Invention]

Figure 3:
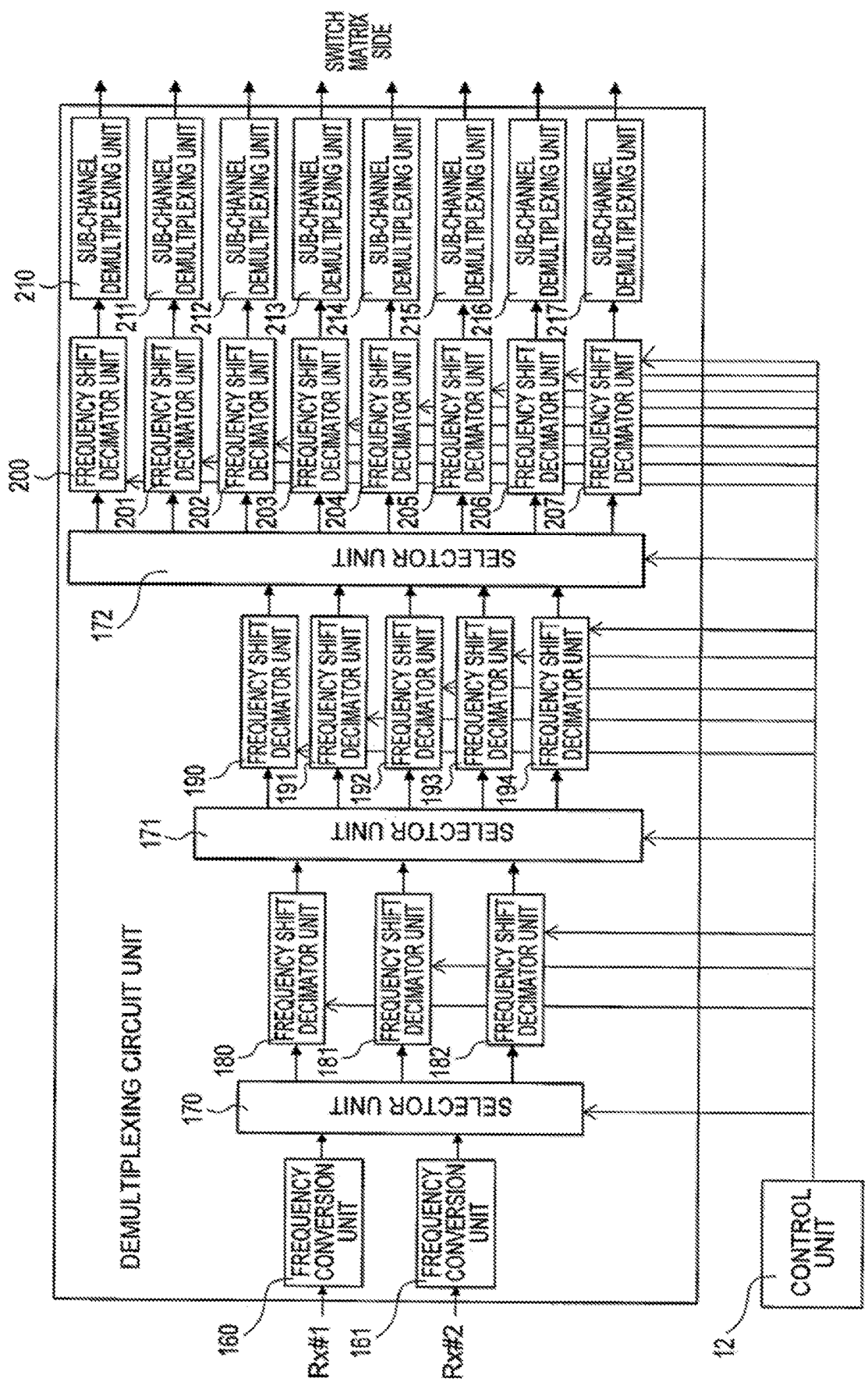
FIG. 3 is a block diagram of the demultiplexing circuit according to the first embodiment of the present invention.
Figure 4:
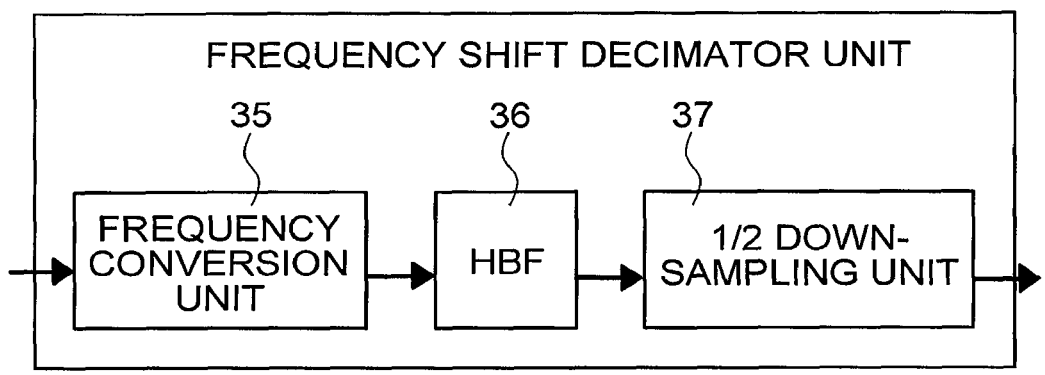
FIG. 4 is a diagram for illustrating a configuration example of each frequency shift decimator unit that is illustrated in FIG. 3 as a frequency shift decimator unit in the first embodiment of the present invention.

Details of the demultiplexing circuit 600 according to the first embodiment are described next. FIG. 3 is a block diagram of the demultiplexing circuit 600 according to the first embodiment of the present invention. FIG. 4 is a diagram for illustrating a configuration example of each of frequency shift decimator units (180 to 182, 190 to 194, and 200 to 207) that are illustrated in FIG. 3 as frequency shift decimator units in the first embodiment of the present invention. The frequency shift decimator unit corresponds to a frequency decimation circuit.

As illustrated in FIG. 4, the frequency shift decimator unit includes a frequency conversion unit 35, a half-band filter (hereinafter abbreviated as "HBF") 36, and a ½ down-sampling.

The frequency conversion unit 35 converts the frequency of an input signal so that the center frequency of a signal band to be extracted by the HBF 36 is a baseband frequency (0 Hz). The HBF 36 extracts a desired signal band from the frequency-converted input signal. The ½ down-sampling unit 37 performs down-sampling on the signal extracted by the HBF 36 to reduce the sampling rate of the signal to ½. The down-sampling used here is not limited to ½ down-sampling.

The passband width of the HBF 36 is half the operation clock rate of the HBF 36. The frequency shift decimator unit accordingly outputs a signal whose sampling rate is half the sampling rate of the input signal. The configuration illustrated in FIG. 4 is an example, and the filter to be used is not limited to the HBF 36, and may be a normal low pass filter.

The operation of the demultiplexing circuit 600 of FIG. 3 is described next referring also to FIG. 5, which is described later.

The demultiplexing circuit receives signals each having an intermediate frequency (IF) between Rx#1 and Rx#2 as input signals. The received intermediate frequency (IF) signals are converted into baseband signals by frequency conversion units 160 and 161. This function is not required when an input signal of the demultiplexing circuit is already a baseband signal.

A control unit 12 in FIG. 3 controls the operation of selector units 170, 171, and 172 and the operation of the frequency shift decimator units 180 to 182, 190 to 194, and 200 to 207 based on a command signal transmitted from the control station 4 on the ground with regards to frequency allocation.

The specifics of this operation are described later. The command signal is transmitted to a satellite in which the multiplexing circuit unit is installed via a communication line that uses another frequency band, for example, the S band.

Figure 5:
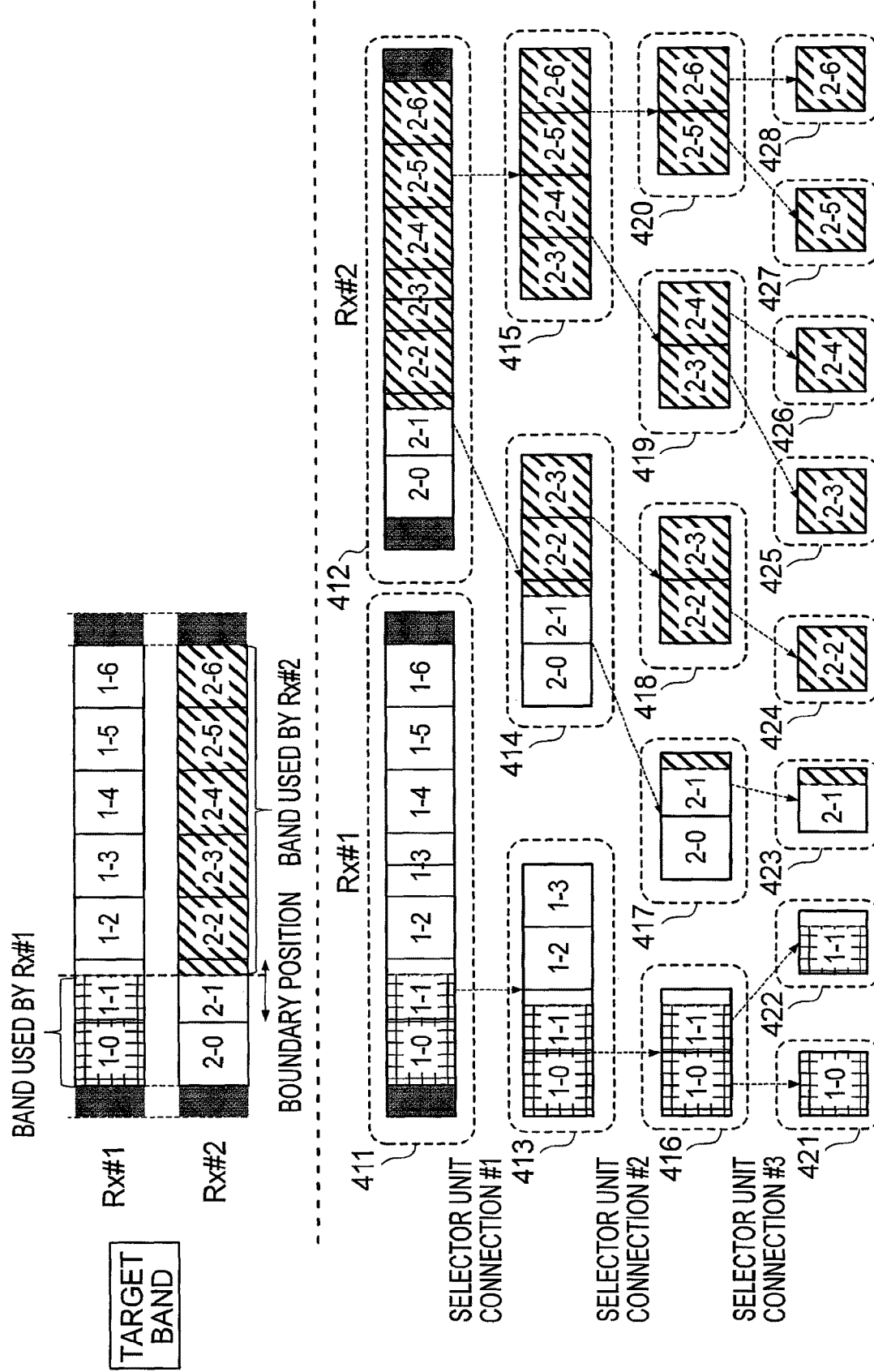
FIG. 5 is a diagram for illustrating a first operation example of the demultiplexing circuit according to the first embodiment of the present invention that has the configuration of FIG. 3.

FIG. 5 is a diagram for illustrating a first operation example of the demultiplexing circuit 600 according to the first embodiment of the present invention that has the configuration of FIG. 3. In FIG. 5, Rx#1 and Rx#2 represent basically the same things as those in FIG. 1. That is, Rx#1 represents the spectrum of a signal from the beam area #1, and Rx#2 represents the spectrum of a signal from the beam area #2.

A signal corresponding to f1 of FIG. 1 is indicated by a cross-hatched portion and a signal corresponding to f2 of FIG. 1 is indicated by a diagonally shaded portion.

In FIGS. 5, 1-0 to 1-6 and 2-0 to 2-6 indicate beam area numbers and spectra. More specifically, N and M in "N-M" represent a beam area number and a frequency number, respectively.

A signal spectrum 411 in FIG. 5 is the spectrum of a baseband signal converted from a reception signal Rx#1, which is received from the beam area #1. Similarly, a signal spectrum 412 in FIG. 5 is the spectrum of a baseband signal converted from a reception signal Rx#2, which is received from the beam area #2.

The selector unit 170 of FIG. 3 outputs one of two signals 411 and 412 to three frequency shift decimator units in the downstream 180, 181, and 182 based on a command from the control unit 12. The selector unit 170 accordingly makes two copies of one of input signals, and outputs three signals in total to the downstream.

Depending on the specifics of the command from the control unit 12, there is a case in which no copies are made in the selector unit 170 and two input signals are connected to two selected outputs ports, while the one remaining output port is left unconnected.

In the example of FIG. 5, the selector unit 170 outputs the input signal 411 (Rx#1) to the frequency shift decimator unit 180, copies the input signal 412 (Rx#2) therein to obtain two signals 412, and then outputs the signals 412 to the frequency shift decimator units 181 and 182.

The frequency shift decimator units 180 to 182 each have a configuration that allows the frequency conversion unit 35 included in the frequency shift decimator unit to set the amount of frequency shift to any value based on a command from the control unit 12. This variable frequency shift function enables the frequency shift decimator units 180 to 182 to freely set, to an input signal, a target band (=half the bandwidth of the input signal) to be extracted from the input signal.

Specifically, the frequency shift decimator units 180 to 182 each control the amount of frequency shift so that the center frequency of a target band to be extracted from an input signal matches the center frequency of the HBF 36 in the downstream, based on a command from the control unit 12.

Through this processing, only the target band (=half the band of the input signal) to be extracted from the input signal passes through the HBF 36, receives down-sampling processing in the ½ down-sampling unit 37 to have a sampling rate reduced to ½ (↓2), and is output.

In the example of FIG. 5, the frequency shift decimator unit 180 executes the operation of extracting the left-half (=the half lower in frequency) band of the input signal 411 (Rx#1), based on a command from the control unit 12. A signal 413 in FIG. 5 is extracted as a result.

Similarly, the frequency shift decimator unit 181 executes the operation of extracting the left-half (=the half lower in frequency) band of the input signal 412 (Rx#2), based on a command from the control unit 12, and the frequency shift decimator unit 182 executes the operation of extracting the right-half (=the half higher in frequency) band of the input signal 412 (Rx#2), based on a command from the control unit 12. Signals 414 and 415 in FIG. 5 are extracted as a result.

Next, the selector unit 171 of FIG. 3 receives signals input from the frequency shift decimator units 180, 181, and 182 of FIG. 3, copies some of the three input signals therein to obtain two identical signals for each copied input signal, and outputs each signal to one of the frequency shift decimator units 190, 191, 192, 193, and 194 in the downstream, based on a command from the control unit 12.

In the example of FIG. 5, the selector unit 171 outputs the input signal 413 to the frequency shift decimator unit 190, copies the input signal 414 therein to obtain two input signals 414 and output the input signals 414 to the frequency shift decimator units 191 and 192, and copies the input signal 415 therein to obtain two input signals 415 and output the input signals 415 to the frequency shift decimator units 193 and 194.

The frequency shift decimator units 190, 191, 192, 193, and 194 each extract, from an input signal, any target band (=half the bandwidth of the input signal), based on a command from the control unit 12.

In the example of FIG. 5, the frequency shift decimator unit 190 executes the operation of extracting the left-half band of the input signal 413, based on a command from the control unit 12. A signal 416 in FIG. 5 is extracted as a result.

Similarly, the frequency shift decimator unit 191 executes the operation of extracting the left-half band of the input signal 414, and the frequency shift decimator unit 192 executes the operation of extracting the right-half band of the input signal 414. Signals 417 and 418 are extracted as a result.

Further, similarly, the frequency shift decimator unit 193 executes the operation of extracting the left-half band of the input signal 415, and the frequency shift decimator unit 194 executes the operation of extracting the right-half band of the input signal 415. Signals 419 and 420 are extracted as a result.

Next, the selector unit 172 of FIG. 3 receives signals input from and extracted by the frequency shift decimator units 190, 191, 192, 193, and 194 of FIG. 3, copies some of the five input signals to obtain two identical signals for each copied input signal, and outputs each signal to one of the frequency shift decimator units 200, 201, 202, 203, 204, 205, 206, and 207 in the downstream, based on a command from the control unit 12.

In the example of FIG. 5, the selector unit 172 copies the input signal 416 to obtain two input signals 416 and output the input signals 416 to the frequency shift decimator units 200 and 201, and output the input signal 417 to the frequency shift decimator unit 202.

Further, the selector unit 172 outputs the input signal 418 to the frequency shift decimator unit 203, copies the input signal 419 therein to obtain two input signals 419 and output the input signals 419 to the frequency shift decimator units 204 and 205.

Further, the selector unit 172 copies the input signal 420 therein to obtain two input signals 420 and output the input signals 420 to the frequency shift decimator units 206 and 207.

The frequency shift decimator units 200, 201, 202, 203, 204, 205, 206, and 207 each extract, from an input signal, any target band (=half the bandwidth of the input signal), based on a command from the control unit 12, similarly to the frequency shift decimator units 180 to 182 and 190 to 194 described above.

In the example of FIG. 5, the frequency shift decimator unit 200 executes the operation of extracting the left-half band of the input signal 416, based on a command from the control unit 12. A signal 421 is extracted as a result. Similarly, the frequency shift decimator unit 201 extracts the right-half band of the input signal 416, and the frequency shift decimator unit 202 extracts the right-half band of the input signal 417. Signals 422 and 423 are extracted as a result.

Further, similarly, the frequency shift decimator unit 203 extracts the left-half band of the input signal 418, and the frequency shift decimator unit 204 extracts the left-half band of the input signal 419. Signals 424 and 425 are extracted as a result.

Further, similarly, the frequency shift decimator unit 205 extracts the right-half band of the input signal 419, the frequency shift decimator unit 206 extracts the left-half band of the input signal 420, and the frequency shift decimator unit 207 extracts the right-half band of the input signal 420. Signals 426, 427, and 428 are extracted as a result.

The signals 421, 422, 423, 424, 425, 426, 427, and 428 extracted in this manner are input to sub-channel demultiplexing units 210 to 217, respectively, in the downstream, and are each demultiplexed into Y pieces of sub-channel data.

The value of Y may be any value as long as the value is an integer equal to or more than 1, for example, 32. The demultiplexing processing in the sub-channel demultiplexing circuits may be based on Patent Literature 3 or may be based on Patent Literature 1.

When Y is 1, the demultiplexing processing is not executed, a "reception channel filter unit" described in Patent Literature 3 alone is included, and only waveform shaping processing similar to the one in Patent Literature 3 is executed.

The "reception channel filter unit" may be omitted and, in that case, a "transmission channel filter unit" described in Patent Literature 3 is provided in a sub-channel multiplexing circuit, which is described later. When Y is 1 and the "reception channel filter unit" is omitted, each sub-channel multiplexing circuit ultimately outputs input data as it is without processing the input data in any manner.

The 8Y pieces of sub-channel data in total are processed by, for example, time division multiplexing, and the resultant data is transmitted to the switch matrix 800 in the downstream.

The switch matrix 800 in the downstream executes processing of selecting and routing only sub-channel data to be relayed out of the transmitted pieces of sub-channel data, and discarding the rest. Assuming that Y has a large enough value (i.e., the number of demultiplexed frequencies of the sub-channel demultiplexing circuit is large enough), the switch matrix 800 extracts only bands to be relayed, which correspond to cross-hatched portions and diagonally shaded portions of the signals 421, 422, 423, 424, 425, 426, 427, and 428 in the example of FIG. 5.

As is clear from the example of FIG. 5, most of a signal is a band to be relayed (i.e., the area of a cross-hatched portion or a diagonally shaded portion), and only few pieces of useless sub-channel data (i.e., a portion that is neither a cross-hatched portion nor a diagonally shaded portion) remain.

This is because unoccupied bands, which are not required to be relayed in stages, have been discarded in the series of processing steps of the demultiplexing circuit units 600 and 601 in the upstream. The rate of data transmission between the demultiplexing circuit units 600 and 601 in the upstream and the switch matrix 800 is accordingly kept low by this processing. The switch matrix 800 is consequently saved from useless relaying of unoccupied band, and the effect of reducing the amount of switching processing is obtained.

Figure 6:
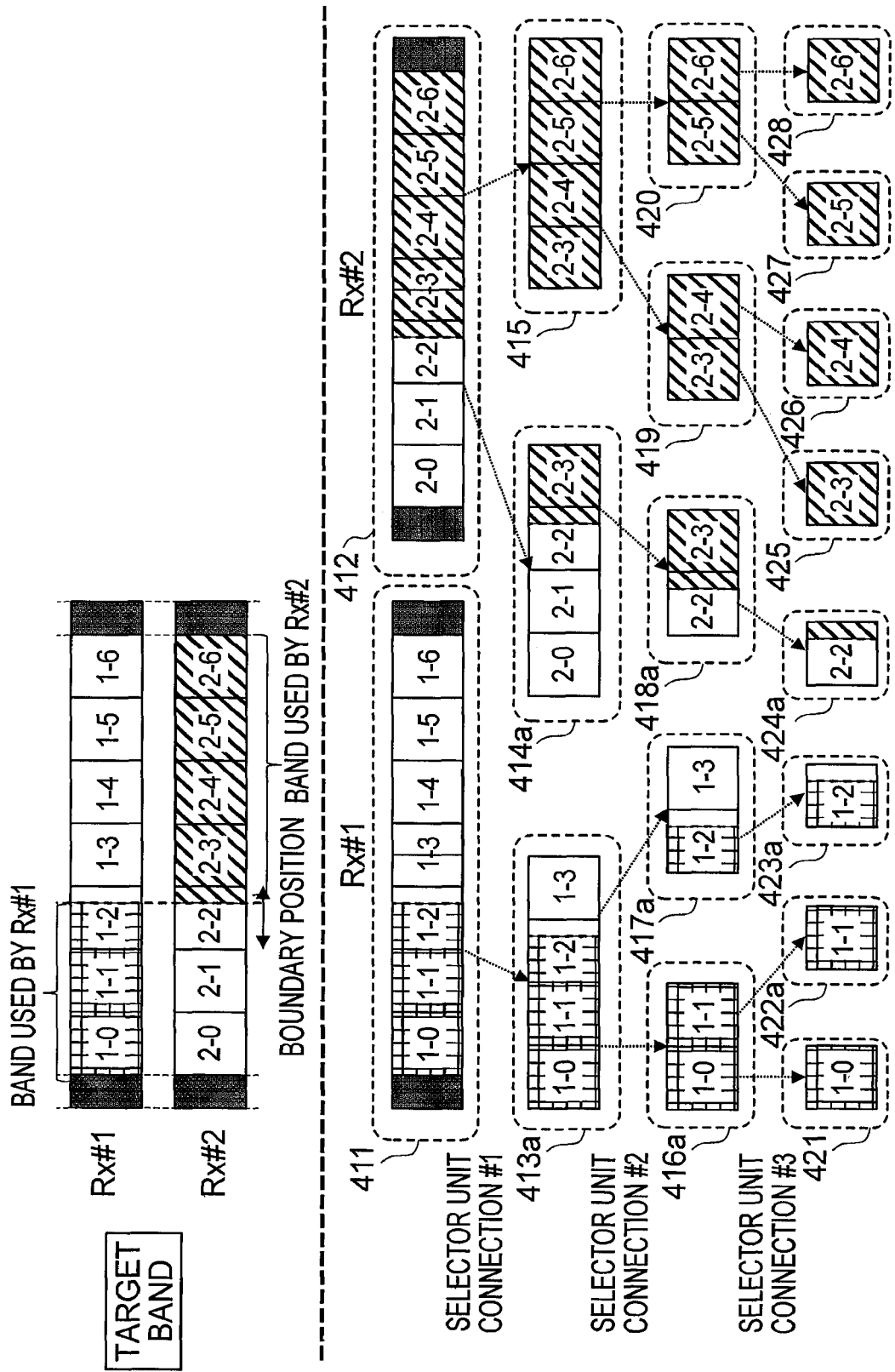
FIG. 6 is a diagram for illustrating a second operation example of the demultiplexing circuit according to the first embodiment of the present invention that has the configuration of FIG. 3.

FIG. 6 is a diagram for illustrating a second operation example of the demultiplexing circuit 600 according to the first embodiment of the present invention that has the configuration of FIG. 3. In FIG. 6, components are denoted by the same reference symbols that are used in FIG. 5, and the second operation example different from the first operation example is illustrated. A comparison between the second operation example of FIG. 6 and the first operation example of FIG. 5 reveals that the band used by Rx#1 in FIG. 6 is slightly increased from the one in the case of FIG. 5, and that the band used by Rx#2 in FIG. 6 is conversely reduced that much from the one in the case of FIG. 5.

The shift from FIG. 5 to FIG. 6 is executed by a command from the control station 4 on the ground when, for example, the required traffic of the beam area #1 to which the band of Rx#1 is allocated decreases while the required traffic of the beam area #2 to which the band of Rx#2 is allocated increases.

The control unit 12 controls the selector units 170, 171, and 172 of the demultiplexing circuit, the amount of frequency shift of the frequency shift decimator units 180 to 182, 190 to 194, and 200 to 207 of the demultiplexing circuit, and the switch matrix 800, based on a command from the control station 4 on the ground.

FIG. 6 differs from FIG. 5 in signals 413*a*, 414*a*, 416*a*, 417*a*, 418*a*, 422*a*, 423*a*, and 424*a* of FIG. 6 and the connection of the selector units 170 to 172.

The signal 413*a* is increased in cross-hatched portion from the signal 413 as the bandwidth used by Rx#1 increases. However, the signal 413*a* and the signal 413 have the same combinations of a beam area number (N) and a frequency number (M) of "1-0", "1-1", "1-2", and "1-3".

Meanwhile, the signal 414*a* is decreased in diagonally shaded portion from the signal 414 as the bandwidth used by Rx#2 decreases. However, the signal 414*a* and the signal 414 have the same combinations of a beam area number (N) and a frequency number (M) of "2-0", "2-1", "2-2", and "2-3".

The connection state of the selector unit 170 in the upstream is also the same. Despite the increase of the used band from FIG. 5 to FIG. 6, carriers in the signals 413 and 414 that are already being relayed by the demultiplexing circuit in FIG. 5 therefore pass through the demultiplexing circuit in the same way as in FIG. 5. Consequently, this change in settings does not affect the signals 413*a* and 414*a*.

The decrease in the used bandwidth of the signal 414*a* from the signal 414 is allowed to occur after the termination of a call or the like causes the absence of carriers. The change in used bandwidth accordingly does not hinder communication of users.

Similarly, there is no change in the connection state of the selector unit 170 in the upstream for carriers passing through the signal 415, which is the same as in FIG. 5. Despite the increase of the used band from FIG. 5 to FIG. 6, carriers in the signal 415 that are already being relayed by the demultiplexing circuit in FIG. 5 therefore pass through the demultiplexing circuit in the same way as in FIG. 5. Consequently, this change in settings does not affect the signal 415.

Similarly to the signal 413*a*, the signal 416*a* is increased in cross-hatched portion from the signal 416 as the bandwidth used by Rx#1 increases. However, the signal 416*a* and the signal 416 have the same combinations of a beam area number (N) and a frequency number (M) of "1-0" and "1-1".

The connection state of the selector unit 171 in the upstream is also the same. Despite the increase of the used band from FIG. 5 to FIG. 6, carriers in the signal 416 that are already being relayed by the demultiplexing circuit in FIG. 5 therefore pass through the demultiplexing circuit in the same way as in FIG. 5. Consequently, this change in settings does not affect the signal 416*a*.

Similarly to the signal 414, the signal 418*a* is decreased in diagonally shaded portion from the signal 418 as the bandwidth used by Rx#2 decreases. However, the signal 418*a* and the signal 418 have the same combinations of a beam area number (N) and a frequency number (M) of "2-2" and "2-3".

The connection state of the selector unit 171 in the upstream is also the same. Despite the decrease of the used band from FIG. 5 to FIG. 6, carriers in the signal 418 that are already being relayed by the demultiplexing circuit in FIG. 5 therefore pass through the demultiplexing circuit in the same way as in FIG. 5, excluding carriers that are disappeared by the termination of a call or the like. Consequently, this change in settings does not affect the signal 418*a*.

Similarly, the signals 419 and 412 of FIG. 6 are the same as the signals 419 and 420 of FIG. 5 in aspects including the connection state of the selector unit 171 in the upstream, and are not affected by this change in settings.

While signals 2-0 and 2-1 extracted from the signal 414 are input to the signal 417 in FIG. 5, signals 1-2 and 1-3 extracted from the signal 413*a* are input to the signal 417*a* in FIG. 6.

The input switching is executed when the cross-hatched portion enters not only the blocks of 1-0 and 1-1 but also the block of 1-2 as the bandwidth used by Rx#1 increases. This phenomenon is in conjunction with a phenomenon in which the diagonally shaded portion covering 2-1, 2-2, and 2-3 shrinks to 2-2 and 2-3, and the block 2-1 becomes an unoccupied band as the bandwidth used by Rx#2 decreases. In other words, the input switching is executed after the diagonally shaded portion in the signal 417 of FIG. 5 disappears and leaves an unoccupied band.

This switching is accordingly not accompanied with forced disconnection of carriers being relayed by the channelizer in normal operation, with the exception of an emergency.

Next, at the last stage in the downstream of the selector unit 172, the signal 422*a* is similar to the signal 416*a* in that the cross-hatched portion in the signal 422*a* is increased from the signal 422 as the bandwidth used by Rx#1 increases. The signal 422*a* and the signal 422 have the same combination of a beam area number (N) and a frequency number (M) of "1-1".

The connection state of the selector unit 172 in the upstream is also the same. Despite the increase of the used band from FIG. 5 to FIG. 6, carriers in the signal 422 that are already being relayed by the demultiplexing circuit in FIG. 5 therefore pass through the demultiplexing circuit in the same way as in FIG. 5. Consequently, this change in settings does not affect the signal 422*a*.

Similarly, the signal 424*a* is also decreased in diagonally shaded portion from the signal 424 as the bandwidth used by Rx#2 decreases. However, the signal 424*a* and the signal 424 have the same combination of a beam area number (N) and a frequency number (M) of "2-2".

The connection state of the selector unit 172 in the upstream is also the same. Despite the decrease of the used band from FIG. 5 to FIG. 6, carriers in the signal 424 that are already being relayed by the demultiplexing circuit in FIG. 5 therefore pass through the demultiplexing circuit in the same way as in FIG. 5, excluding carriers that are disappeared by the termination of a call or the like. Consequently, this change in settings does not affect the signal 424*a*.

Similarly, the signals 421, 425, 426, 427, and 428 of FIG. 6 are the same as the signals 419 and 420 of FIG. 5 in aspects including the connection state of the selector unit in the upstream. As a result, signals 421, 425, 426, 427, and 428 are not affected by this change in settings.

While the signal 2-1 extracted from the signal 417 are input to the signal 423 in FIG. 5, the signal 1-2 extracted from the signal 417*a* are input to the signal 423*a* in FIG. 6.

The input switching is executed when, as described in the operation of the signal 417*a*, the cross-hatched portion enters not only the blocks of 1-0 and 1-1 but also the block of 1-2 as the bandwidth used by Rx#1 increases.

This phenomenon is in conjunction with a phenomenon in which the diagonally shaded portion covering 2-1, 2-2, and 2-3 shrinks to 2-2 and 2-3, and the block 2-1 becomes an unoccupied band as the bandwidth used by Rx#2 decreases. In other words, the input switching is executed after the diagonally shaded portion in the signal 423 of FIG. 5 disappears and leaves an unoccupied band.

This switching is accordingly not accompanied with forced disconnection of carriers being relayed by the channelizer in normal operation, with the exception of an emergency.

The signals 421, 422*a*, 423*a*, 424*a*, 425, 426, 427, and 428 of FIG. 6 are each demultiplexed into Y pieces of sub-channel data by the sub-channel demultiplexing units 210 to 217 in the downstream, and the sub-channel data is input to the switch matrix 800.

The switch matrix 800 executes processing of selecting and routing only sub-channel data to be relayed out of the input pieces of sub-channel data, and discarding the rest. In the case of FIG. 6, the switch matrix 800 extracts only bands to be relayed, which correspond to cross-hatched portions and diagonally shaded portions of the signals 421, 422*a*, 423*a*, 424*a*, 425, 426, 427, and 428.

As described above, the application of the demultiplexing circuit according to the present invention allows carriers already being relayed by the demultiplexing circuit in FIG. 5 to pass through the demultiplexing circuit in the same way as in FIG. 5, even when the bandwidths used by the beam areas #1 and #2 are changed from the allocation of FIG. 5 to the allocation of FIG. 6 during operation. This change in settings is thus proven to not affect the carriers.

This means that it is not required to suspend the communication of carrier signals being relayed in order to change the used bandwidth. A real-time change in band allocation in response to a change in required traffic is therefore accomplished by applying the demultiplexing circuit according to the present invention.

Figure 7:
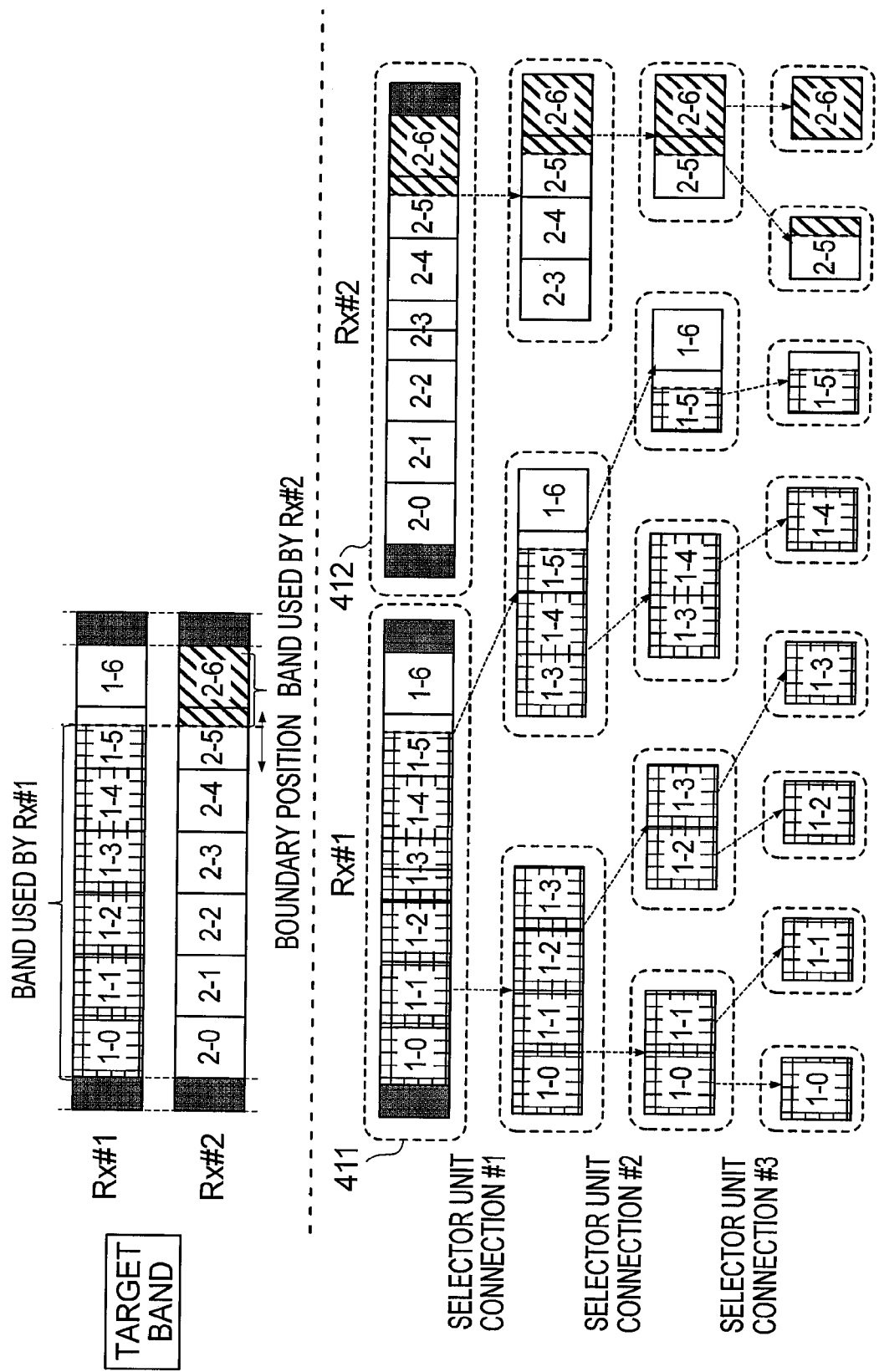
FIG. 7 is a diagram for illustrating a third operation example of the demultiplexing circuit according to the first embodiment of the present invention that has the configuration of FIG. 3.

A third operation example is described not in detail but in a supplementary manner with reference to FIG. 7. FIG. 7 is a diagram for illustrating the third operation example of the demultiplexing circuit 600 according to the first embodiment of the present invention that has the configuration of FIG. 3. In FIG. 7, components are denoted by the same reference symbols that are used in FIG. 5 and FIG. 6, and the third operation example different from the first operation example and the second operation example is illustrated.

A comparison between the first operation example of FIG. 5 and the third operation example of FIG. 7 reveals that the band used by Rx#1 in FIG. 7 is considerably increased from the one in the case of FIG. 5, and that the band used by Rx#2 in FIG. 6 is conversely considerably reduced from the one in the case of FIG. 5. It is proven in FIG. 7 that, in this case, too, concurrent demultiplexing of two beams and a bandwidth allocation change without an adverse effect to carriers being communicated are accomplished by the same processing as the one described above.

As is clear from the cases of FIG. 6 and FIG. 7, every one of the signals 421 to 428 of FIG. 6, or every one of the signals 421, 422*a* to 424*a*, and 425 to 428 of FIG. 7, is mostly a band to be relayed (a cross-hatched portion or a diagonally shaded portion), and only few pieces of useless sub-channel data (=a white portion=a portion that is neither a cross-hatched portion nor a diagonally shaded portion) remain. The switch matrix 800 is consequently saved from useless relaying of an unoccupied band, and the effect of reducing the amount of switching processing is obtained in the cases of FIG. 6 and FIG. 7 as well.

The configuration of the demultiplexing circuit illustrated in FIG. 3 is an example. Any number of signals equal to or more than two may be input to the demultiplexing circuit. The selector in FIG. 3 has three stages, namely, the selector units 170, 171, and 172. However, the selector in the first embodiment is not limited to a three-stage configuration, and may have, for example, a single-stage, two-stage, four-stage, or five-stage configuration.

In short, a feature of the demultiplexing circuit according to the present application is that circuits combining selectors and frequency shift decimator units are connected in a plurality of stages in a tree format to form a multi-stage demultiplexing circuit, and an example of the multi-stage demultiplexing circuit is illustrated in FIG. 3.

With any configuration, demultiplexing processing can be executed while preventing an output signal that includes an unused band portion from being output to the downstream, and a signal obtained as a result of the demultiplexing processing has only few pieces of useless sub-channel data left. To give a supplementary description, the technical meaning of "preventing an output signal that includes an unused band portion from being output" is not to "completely" prevent the output of an output signal that includes an unused band portion to the downstream, and the phrase means that a "considerably reduced" number of output signals that include an unused band portion are output.

The control unit 12 controls the selector units 170, 171, and 172, and a frequency shift of the frequency shift decimator units 180, 181, 182, 190, 191, 192, 193, 194, 200, 201, 202, 203, 204, 205, 206, and 207 desirably based on information notified in advance from the control station on the ground. The satellite may autonomously control a change in frequency allocation by, for example, measuring power at which each sub-channel signal is received, determining the bands that are used by f1 and f2 from the result of the measurement, and performing the autonomous control based on the determination.

[Details of the Multiplexing Circuit According to the Present Invention]

Figure 8:
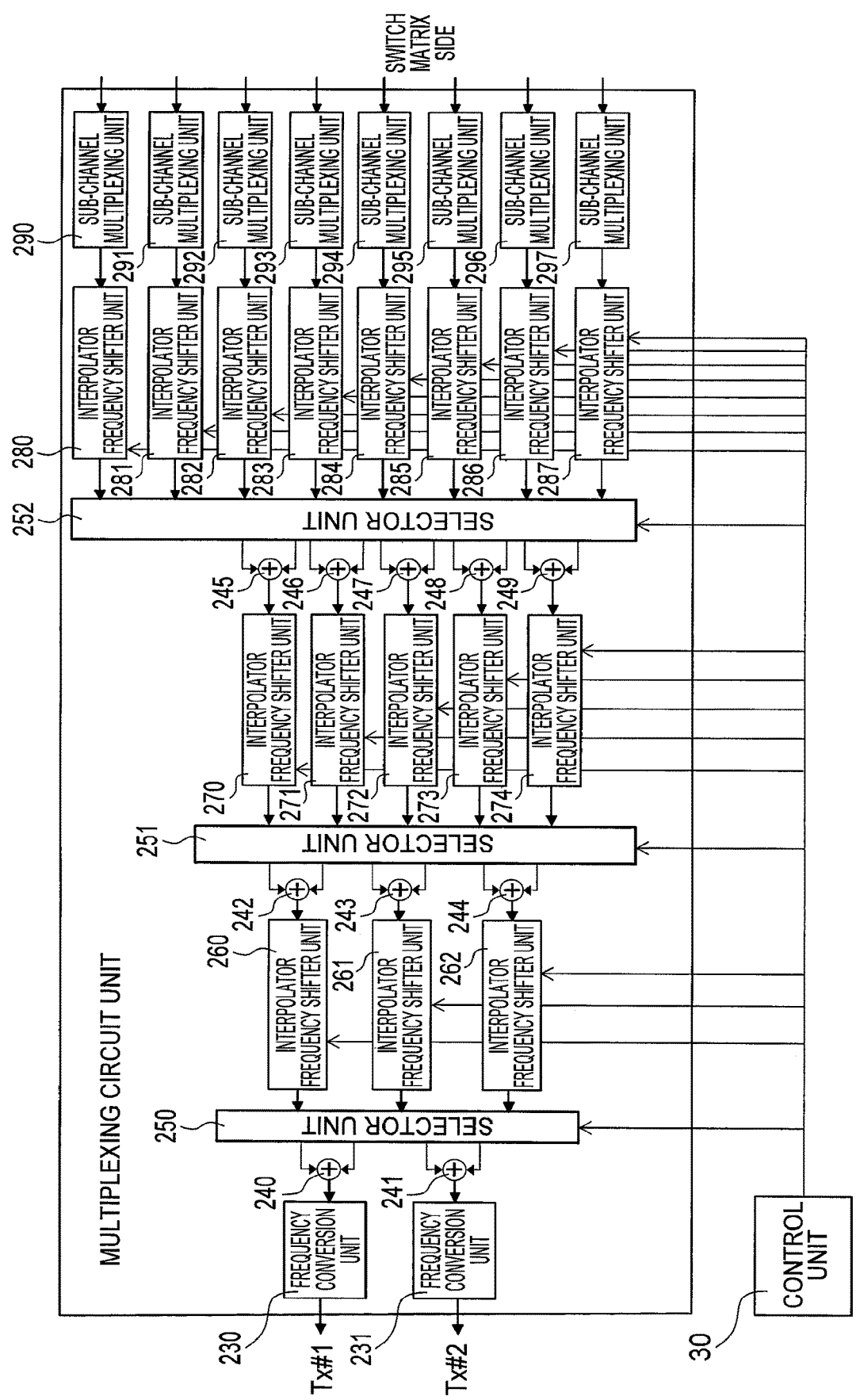
FIG. 8 is a block diagram of the multiplexing circuit according to the first embodiment of the present invention.

Details of the multiplexing circuit 700 according to the first embodiment are described next. FIG. 8 is a block diagram of the multiplexing circuit 700 according to the first embodiment of the present invention.

Sub-channel multiplexing units 290, 291, 292, 293, 294, 295, 296, and 297 receive sub-channel data from the switch matrix 801 in the upstream, and each multiplex Z pieces of sub-channel data.

The value of Z may be any value as long as the value is an integer equal to or more than 1, for example, 32. The multiplexing processing in the sub-channel multiplexing circuits may be based on Patent Literature 3 or may be based on Patent Literature 1. As described above, in the case of a configuration in which the "reception channel filter unit" is omitted on the demultiplexing circuit side, the sub-channel multiplexing circuits each include the "transmission channel filter unit" described in Patent Literature 3.

When Y is 1, the multiplexing processing by the sub-channel multiplexing unit is not executed, and when the sub-channel multiplexing unit does not include the "reception channel filter unit", the "transmission channel filter unit" described in Patent Literature 3 alone is included, and only waveform shaping processing similar to the one in Patent Literature 3 is executed.

Interpolator frequency shifter units 280 to 287 perform interpolation by doubling the sampling rate of output data from the sub-channel multiplexing circuits 290 to 297.

A selector unit 252 distributes signals based on the frequency band in which sub-channel data is transmitted. Subsequently, signal synthesis units 245 to 249 each synthesize two outputs from the interpolator frequency shifter units 280 to 287.

Interpolation is performed also in the downstream by interpolator frequency shifter units 270 to 274 by doubling the sampling rate of output data from the signal synthesis units 245 to 249. The interpolated signals are distributed by a selector unit 251 based on the frequency band for transmission at Tx#1 or Tx#2. The distributed signals are input to signal synthesis units 242, 243, and 244, each of which synthesizes two outputs from the interpolator frequency shifter units 270 to 274.

Interpolator frequency shifter units 260, 261, and 262 in the downstream perform interpolation by doubling the sampling rate of output data from the signal synthesis units 242 to 244. The interpolated signals are distributed by a selector unit 250, and synthesized by signal synthesis units 240 and 241. The synthesized signals are subjected to frequency conversion by frequency conversion units 230 and 231 to have an IF frequency, a transmission RF frequency, or the like, and the converted signals are output.

The illustrated configuration is an example, and three or more output signals may be output. The number of multiplexed frequencies is also not limited to eight. A block upstream of any selector unit may be configured for multiplexing processing of the related art, and not for circuit sharing as in the illustrated configuration. When multiplexing processing of the related art is employed, a reduction in the degree of complication of the selector units, the adoption of a proven circuit, and the like are possible.

The selectors and the interpolator frequency shifter units are controlled desirably based on information notified in advance from a ground station. The satellite may autonomously control the selectors and the interpolator frequency shifter units by determining which band is to be used.

Figure 9:
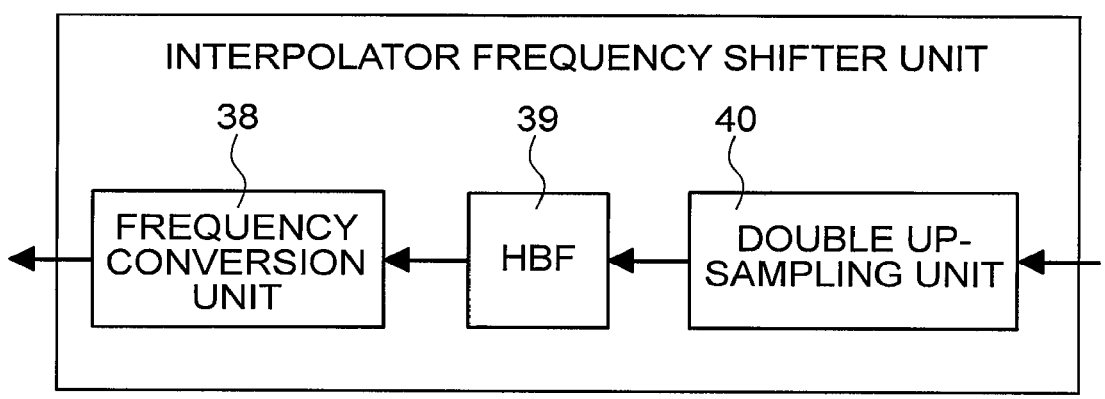
FIG. 9 is a diagram for illustrating a configuration example of each interpolator frequency shifter unit that is illustrated in FIG. 8 as an interpolator frequency shifter unit in the first embodiment of the present invention.

FIG. 9 is a diagram for illustrating a configuration example of each of the interpolator frequency shifter units 260 to 262, 270 to 274, and 280 to 287 that are illustrated in FIG. 8 as interpolator frequency shifter units in the first embodiment of the present invention. The interpolator frequency shifter unit corresponds to a frequency interpolation circuit.

The interpolator frequency shifter unit includes a frequency conversion unit 38, an HBF 39, and a double up-sampling unit 40. The double up-sampling unit 40 performs double up-sampling on an input signal, and inputs the sampled signal to the HBF 39. The up-sampling is not limited to double up-sampling.

The HBF 39 removes an image component from the input signal processed by up-sampling, to extract a desired signal band. The frequency conversion unit 38 converts the signal such that the signal has a frequency to be used in the next stage, and outputs the converted signal. The configuration illustrated in FIG. 9 is an example, and the filter to be used is not limited to the HBF 39 and may be a normal low pass filter.

The operation of the multiplexing circuit 700 illustrated in FIG. 8 is described next referring also to FIG. 10.

Figure 10:
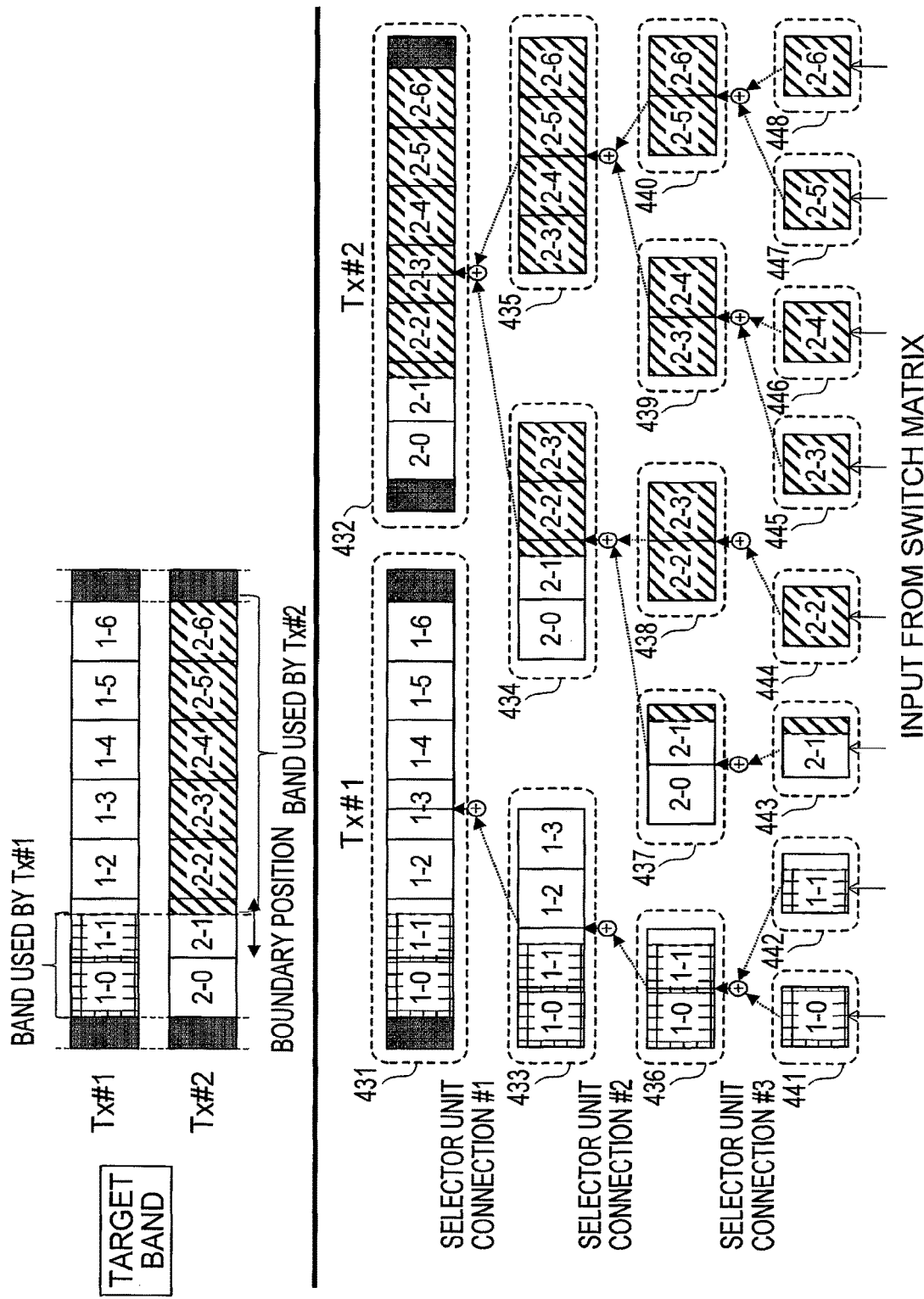
FIG. 10 is a diagram for illustrating a first operation example of the multiplexing circuit according to the first embodiment of the present invention that has the configuration of FIG. 8.

FIG. 10 is a diagram for illustrating a first operation example of the multiplexing circuit 700 according to the first embodiment of the present invention that has the configuration of FIG. 8. How target band selection processing by the selector units 250, 251, and 252 in the multiplexing circuit 700 is switched when multiplexing is executed with the configuration of FIG. 8 is illustrated in FIG. 10.

In the first operation example of FIG. 10, 8×Y pieces of sub-channel data in total are input to the multiplexing circuit 700 from the switch matrix 801. The value of Y may be any value as long as the value is an integer equal to or more than 1, for example, 32.

The switch matrix 801 selects and routes sub-channel data to be relayed out of pieces of sub-channel data. Accordingly, in FIG. 10, bands to be relayed, which correspond to cross-hatched portions and diagonally shaded portions of signals 441, 442, 443, 444, 445, 446, 447, and 448, are input from the switch matrix 801.

Two signals 1-0 and 1-1 out of eight signals are signals to be output from Tx#1. The remaining six signals 2-1, 2-2, 2-3, 2-4, 2-5, and 2-6 are signals to be output from Tx#2. The signals are input from the switch matrix 801, are subjected to up-sampling in the interpolator frequency shifter units 280, 281, 282, 283, 284, 285, 286, and 287, and are then output to the selector unit 252.

The interpolator frequency shifter units 280 to 287 each use the HBF 39 to remove an image component generated by double up-sampling, perform interpolation to double the input data, and are configured so that the amount of frequency shift that is performed on the interpolated data by the frequency conversion unit 38 included in the interpolator frequency shifter unit can be set to any value based on a command from a control unit 30. This variable frequency shift function enables the interpolator frequency shifter units 280 to 287 to set the center frequency of an output signal to any value.

Specifically, based on a command from the control unit 30, the interpolator frequency shifter units 280 to 287 control the shift amount of the center frequency of a target band to be extracted from an input signal so that a single spectrum signal continuous along a frequency axis can be synthesized in the signal synthesis units 245, 246, 247, 248, and 249 in the downstream.

Outputs from the interpolator frequency shifter units 280 to 287 are not always synthesized with another signal, and may be output as they are without being synthesized. This control is performed by the selector unit 252.

Details of the operation of the selector unit 252 are described with reference to FIG. 10. In the example of FIG. 10, the interpolator frequency shifter units 280, 281, 282, 283, 284, 285, 286, and 287 shift the signal 1-0 to the left side (=lower frequency side), shift the signal 1-1 to the right side (=higher frequency side), shift the signal 2-1 to the right side (=higher frequency side), shift the signal 2-2 to the left side (=lower frequency side), shift the signal 2-3 to the left side (=lower frequency side), shift the signal 2-4 to the right side (=higher frequency side), shift the signal 2-5 to the left side (=lower frequency side), and shift the signal 2-6 to the right side (=higher frequency side) to make data twice larger by interpolation. The frequency shifts are controlled based on a command from the control unit 30.

The signal synthesis units 245, 246, 247, 248, and 249 synthesize some of the signals, and outputs the resultant signals as multiplexed signals 436, 437, 438, 439, and 440).

Specifically, the signal synthesis unit 245 synthesizes outputs from the interpolator frequency shifter unit 280 and the interpolator frequency shifter unit 281, the signal synthesis unit 248 synthesizes outputs from the interpolator frequency shifter unit 284 and the interpolator frequency shifter unit 285, and the signal synthesis unit 249 synthesizes outputs from the interpolator frequency shifter unit 286 and the interpolator frequency shifter unit 287.

The other signal synthesis units, namely, the signal synthesis units 246 and 247, do not execute synthesis processing. Specifically, the signal synthesis unit 246 executes processing of allowing an output from the interpolator frequency shifter unit 282 to pass as it is, and the signal synthesis unit 247 executes processing of allowing an output from the interpolator frequency shifter unit 283 to pass as it is.

The synthesis processing and the passing processing described above are controlled by the selector unit 252 located between the interpolator frequency shifter units 280, 281, 282, 283, 284, 285, 286, and 287 and the signal synthesis units 245, 246, 247, 248, and 249.

Based on a command from the control unit 30, the selector unit 252 executes the operation of connecting input signals of the interpolator frequency shifter units 280, 281, 282, 283, 284, 285, 286, and 287 to the signal synthesis units 245, 246, 247, 248, and 249. The selector unit 252 accomplishes control that allows a specific signal synthesis unit in the downstream to pass data as it is without executing the synthesis processing by outputting 0 to one of input ends of the signal synthesis unit.

Next, the synthesized signals 436, 437, 438, 439, and 440 are input to the interpolator frequency shifter units 270, 271, 272, 273, and 274 as illustrated in FIG. 10. The interpolator frequency shifter units 270, 271, 272, 273, and 274 then performs processing of making the input signals twice larger by interpolation while shifting each signal to any target frequency, based on a command from the control unit 30.

In this case, the signal 436 is shifted to the left side (=lower frequency side), the signal 437 is shifted to the left side (=lower frequency side), the signal 438 is shifted to the right side (=higher frequency side), the signal 439 is shifted to the left side (=lower frequency side), and the signal 440 is shifted to the right side (=higher frequency side).

The selector unit 251 outputs each of output signals from the interpolator frequency shifter units 270, 271, 272, 273, and 274 to one of the signal synthesis units 242, 243, and 244, based on a command from the control unit 30. Similarly to the selector unit 252, the selector unit 251 accomplishes control that allows a specific signal synthesis unit in the downstream to pass data as it is without executing the synthesis processing by outputting 0 to one of input ends of the signal synthesis unit.

This operation of the selector unit 251 causes the signal synthesis units 242, 243, and 244 to output signals 433, 434, and 435 illustrated in FIG. 10. Specifically, the signal synthesis unit 243 synthesizes outputs from the interpolator frequency shifter unit 271 and the interpolator frequency shifter unit 272, and the signal synthesis unit 244 synthesizes outputs from the interpolator frequency shifter unit 273 and the interpolator frequency shifter unit 274.

Meanwhile, the signal synthesis unit 242 executes processing of allowing an output from the interpolator frequency shifter unit 270 to pass as it is without executing the synthesis processing.

Next, the synthesized signals 433, 434, and 435 are input to the interpolator frequency shifter units 260, 261, and 262 as illustrated in FIG. 10. The interpolator frequency shifter units 260, 261, and 262 then performs processing of making the input signals twice larger by interpolation while shifting each signal to any target frequency, based on a command from the control unit 30.

In this case, the signal 433 is shifted to the left side (=lower frequency side), the signal 434 is shifted to the left side (=lower frequency side), and the signal 435 is shifted to the right side (=higher frequency side).

The selector unit 250 outputs each of output signals from the interpolator frequency shifter units 260, 261, and 262 to one of the signal synthesis units 240 and 241, based on a command from the control unit 30. Similarly to the selector unit 252, the selector unit 250 accomplishes control that allows a specific signal synthesis unit in the downstream to pass data as it is without executing the synthesis processing by outputting 0 to one of input ends of the signal synthesis unit.

This operation of the selector unit 250 causes the signal synthesis units 240 and 241 to output signals 431 and 432 illustrated in FIG. 10. Specifically, the signal synthesis unit 241 synthesizes outputs from the interpolator frequency shifter unit 261 and the interpolator frequency shifter unit 262.

Meanwhile, the signal synthesis unit 240 executes processing of allowing an output from the interpolator frequency shifter unit 260 to pass as it is without executing the synthesis processing.

The signals 431 and 432 output from the signal synthesis units 240 and 241 are converted by the frequency conversion units 230 and 231 to have, for example, an IF frequency, and the converted signals are output from the multiplexing circuit unit 700. The frequency conversion units 230 and 231 are not required when an output signal interface of the multiplexing circuit is defined by baseband.

Figure 11:
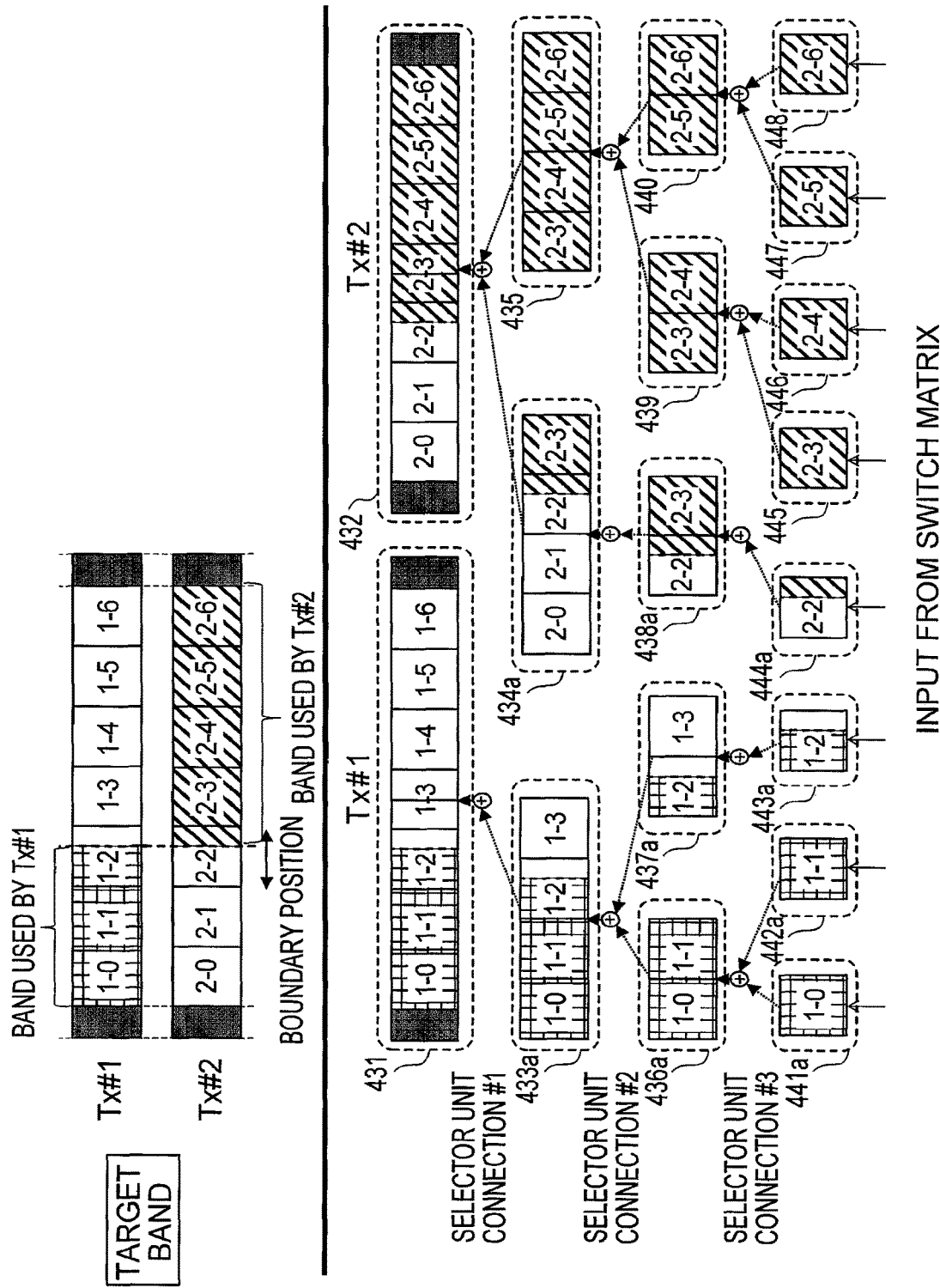
FIG. 11 is a diagram for illustrating a second operation example of the multiplexing circuit according to the first embodiment of the present invention that has the configuration of FIG. 8.

FIG. 11 is a diagram for illustrating a second operation example of the multiplexing circuit 700 according to the first embodiment of the present invention that has the configuration of FIG. 8. Components in FIG. 11 are denoted by the same reference symbols that are used in FIG. 10. How target band selection processing by the selector units 250, 251, and 252 in the multiplexing circuit 700 is switched when multiplexing is executed with the configuration of FIG. 8 is illustrated in FIG. 11.

A comparison to FIG. 10 reveals that, in FIG. 11, the band of Tx#1 (the cross-hatched portion) is increased and the band of Tx#2 (the diagonally shaded portion) is decreased that much. The band allocation is thus changed from the state of FIG. 10 to the state of FIG. 11 when, for example, transmission request traffic to Tx#1 increases while transmission request traffic to Tx#2 decreases.

This change is made in response to a command from the control station 4 on the ground, and the control unit 30 controls the selector units 250, 251, and 252 of the multiplexing circuit 700, the amount of frequency shift of each interpolator frequency shifter unit of the multiplexing circuit 700, and the switch matrix 800, based on a command from the control station 4 on the ground.

The basic processing of the multiplexing circuit according to the present invention in FIG. 11 is the same as in FIG. 10. There are, however, differences, and the following description focuses on the differences from FIG. 10.

In FIG. 11, signals 441a, 442a, 443a, and 444a and the signals 445, 446, 447, and 448 are obtained by multiplexing Y pieces of sub-channel data in the sub-channel multiplexing units 290 to 297 in the upstream. By connection control of the switch matrix 801, a signal that is a part of the signal 443 of FIG. 10 and that is destined to Tx#2 (a signal represented by a partially diagonally shaded block) is replaced in FIG. 11 with a signal that is a part of the signal 443a and that is destined to Tx#1 (a signal represented by a partially cross-hatched block).

As is clear from both of the case of FIG. 10 and the case of FIG. 11, every one of the signals 441 to 448 of FIG. 10, or every one of the signals 441a to 444a and 445 to 448 of FIG. 11, is mostly a band to be relayed (a cross-hatched portion or a diagonally shaded portion), and only few pieces of useless sub-channel data (=a white portion=a portion that is neither a cross-hatched portion nor a diagonally shaded portion) remain. The switch matrix 801 is consequently saved from useless relaying of an unoccupied band, and the effect of reducing the amount of switching processing is obtained in both of the case of FIG. 10 and the case of FIG. 11.

A signal 433a is increased in cross-hatched portion from the signal 433 as the band used by Tx#1 increases. However, the signal 433a and the signal 433 have the same combinations of a beam area number (N) and a frequency number (M), namely, "1-0", "1-1", "1-2", and "1-3".

A signal 434a is decreased in diagonally shaded portion from the signal 434 as the band used by Tx#2 decreases. However, the signal 434a and the signal 434, too, have the same combinations of a beam area number (N) and a frequency number (M), namely, "2-0", "2-1", "2-2", and an unoccupied band.

The connection of the selector unit 250 remains the same. Accordingly, carriers in the signals 433a and 434a pass through the multiplexing circuit in the same way as in FIG. 10 despite a change in used bandwidth from the allocation of FIG. 10 to the allocation of FIG. 11. The carriers are therefore not affected by a change in allocated bandwidth quantity.

Similarly to the signal 434a, a signal 438a is decreased in diagonally shaded portion from the signal 438 as the band used by Tx#2 decreases. However, the signal 438a and the signal 438 have the same combinations of a beam area number (N) and a frequency number (M), namely, "2-2" and an unoccupied band.

The state of the selector unit 251 remains the same. Carriers in the signal 438a, excluding carriers that are disappeared by the termination of a call or the like, accordingly pass through the multiplexing circuit in the same way as in FIG. 10, despite a decrease in used band from the allocation of FIG. 10 to the allocation of FIG. 11, and are therefore unaffected by this change in settings.

Similarly, the signals 439 and 440 of FIG. 11 are the same as the signals 439 and 440 of FIG. 10 in aspects including the connection state of the selector, and are not affected by this setting.

In FIG. 10, a signal from the signal 443 is shifted to the right side (=higher frequency side) in the signal 437, and the signal 437 is output to the multiplexing unit for outputting to the signal 434. In FIG. 11, on the other hand, a signal from the signal 443a is shifted to the left side (=lower frequency side) in a signal 437a, and the signal 437a is output to the multiplexing unit for outputting to a signal 433a.

The switching of the output destination is executed by the selector unit 251. The output destination is switched when a change in bandwidth causes the cross-hatched portion to enter not only the blocks of 1-0 and 1-1 but also the block of 1-2. The switching is to be executed after the band 2-1 that has been allocated to Tx#2 becomes an unoccupied band. This switching is accordingly not accompanied with forced disconnection of communication of carriers being relayed by the channelizer in normal operation, with the exception of an emergency.

The signals 441a, 442a, 444a, 445, 446, 447, and 448 in FIG. 11 and the corresponding signals in FIG. 10 have the same combinations of a beam area number (N) and a frequency number (M). The signals in FIG. 11 accordingly pass through the multiplexing circuit unit in the same way as in FIG. 10, including the switching destination of the selector unit 252, and are therefore not affected by this change in settings.

Similarly, the signals 436a, 438a, 439, and 440 in FIG. and the corresponding signals in FIG. 10 have the same combinations of a beam area number (N) and a frequency number (M) as well. The signals in FIG. 11 accordingly pass through the multiplexing circuit unit in the same way as in FIG. 10, including the switching destination of the selector unit 251, and are therefore not affected by this change in settings.

The signal 438a is reduced in used band but is not changed in signal path. The signal 438a is accordingly not affected by this change in settings.

Similarly, the signals 433a, 434a, 435, 431, and 432 in FIG. 11 and the corresponding signals in FIG. 10 have the same combinations of a beam area number (N) and a frequency number (M) as well. The signals in FIG. 11 accordingly pass through the multiplexing circuit unit in the same way as in FIG. 10, including the switching destination of the selector unit 250, and are therefore not affected by this change in settings.

As described above, the application of the multiplexing circuit according to the present invention allows carriers already being relayed by the multiplexing circuit unit in FIG. 10 to pass through the multiplexing circuit unit in the same way as before the change, even when the bandwidths used by the Tx#1 and Tx#2 are changed from the allocation of FIG. 10 to the allocation of FIG. 11 during operation. The multiplexing circuit according to the first embodiment is thus proven not to be affected by the change in settings.

This means that it is not required to suspend the communication of carrier signals being relayed in order to change the used bandwidth. A real-time change in band allocation in response to a change in required traffic is therefore accomplished by applying the multiplexing circuit according to the present invention in addition the demultiplexing circuit unit according to the present invention described above.

Figure 12:
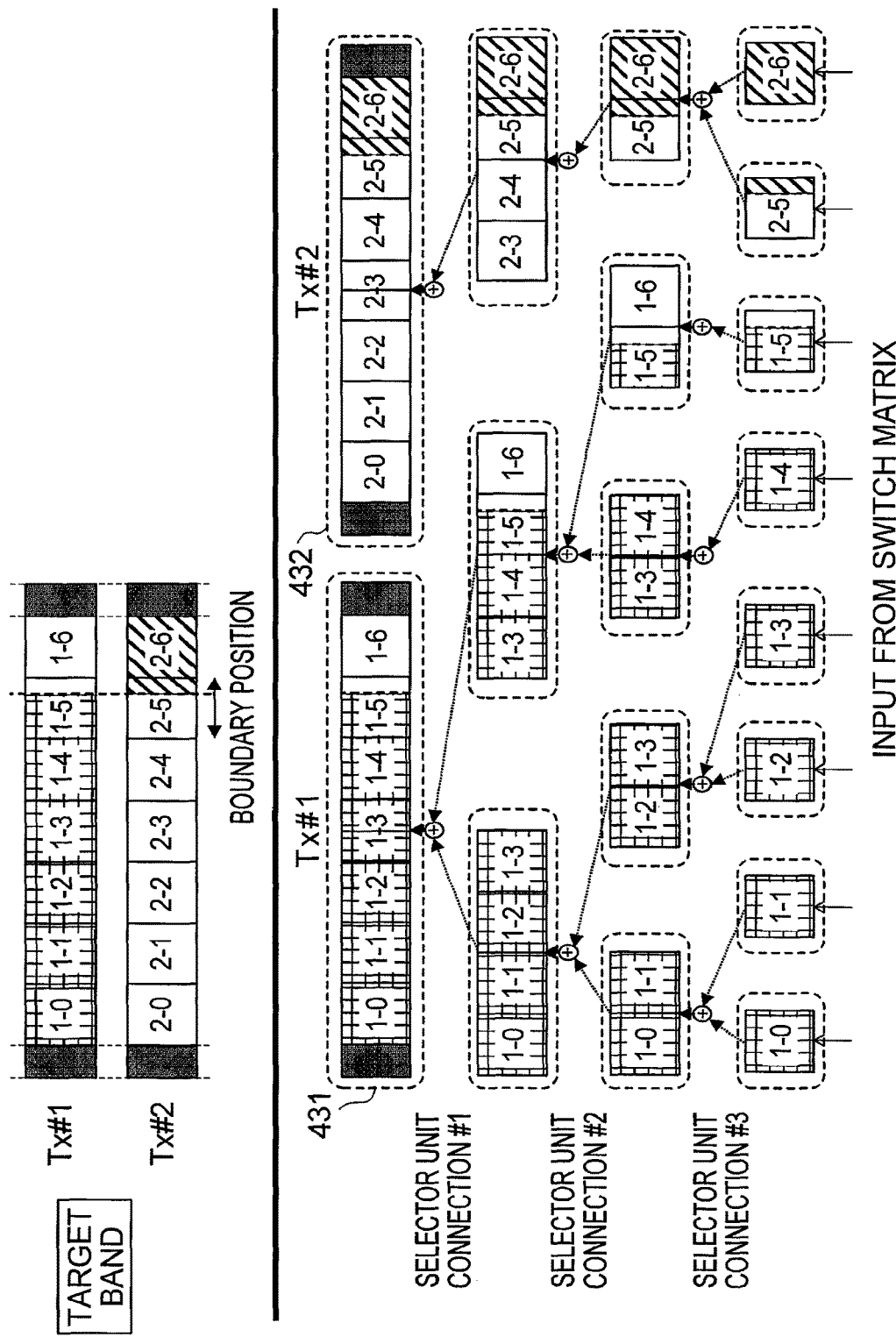
FIG. 12 is a diagram for illustrating a third operation example of the multiplexing circuit according to the first embodiment of the present invention that has the configuration of FIG. 8.

A third operation example is described not in detail but in a supplementary manner with reference to FIG. 12. FIG. 12 is a diagram for illustrating a third operation example of the multiplexing circuit 700 according to the first embodiment of the present invention that has the configuration of FIG. 8. In FIG. 12, components are denoted by the same reference symbols that are used in FIG. 10 and FIG. 11, and the third operation example different from the first operation example and the second operation example is illustrated.

A comparison between the first operation example of FIG. 10 and the third operation example of FIG. 12 reveals that the band used by Tx#1 in FIG. 12 is considerably increased from the one in the case of FIG. 10, and that the band used by Rx#2 in FIG. 12 is considerably reduced from the one in the case of FIG. 10. It is proven in FIG. 12 that, in this case, too, concurrent multiplexing of two beams and a bandwidth allocation change without an adverse effect to carriers being communicated are accomplished by the same processing as the one described above.

The configuration of the multiplexing circuit illustrated in FIG. 8 is an example. Any number of signals equal to or more than two may be input to the multiplexing circuit. The selector in FIG. 8 has three stages of 250, 251, and 252. However, the selector in the first embodiment is not limited to a three-stage configuration, and may have, for example, a single-stage, two-stage, four-stage, or five-stage configuration.

In short, a feature of the multiplexing circuit according to the present application is that circuits combining interpolator frequency shifter units and selectors are connected in a plurality of stages in a tournament format to form a multi-stage multiplexing circuit, and an example of the multi-stage multiplexing circuit is illustrated in FIG. 8.

With any configuration, multiplexing processing can be executed by using, as an input, a plurality of pre-multiplexing signals that contain at least a part of a used band, and a change in band allocation is accomplished without an adverse effect to carriers being communicated.

The control unit 30 performs control desirably based on information notified in advance from the control station on the ground. The satellite may autonomously control a change in frequency allocation by, for example, measuring power at which each sub-channel signal is received, determining the bands that are used by f1 and f2 from the result of the measurement, and performing the autonomous control based on the determination.

REFERENCE SIGNS LIST 170, 171, 172 selector unit (selector); 180, 181, 182, 190, 191, 192, 193, 194, 200, 201, 202, 203, 204, 205, 206, 207 frequency shift decimator unit (frequency shift decimator circuit); 600, 601 demultiplexing circuit unit (demultiplexing circuit); 250, 251, 252 selector unit (selector); 260, 261, 262, 270, 271, 272, 273, 274, 280, 281, 282, 283, 284, 285, 286, 287 interpolator frequency shifter unit (frequency interpolation circuit); 700, 701 multiplexing circuit unit (multiplexing circuit)

The invention claimed is:

1. A demultiplexing circuit, which is capable of demultiplexing a reception signal into a plurality of signals, the demultiplexing circuit comprising a multi-stage demultiplexing circuit in which frequency shift decimator circuits are connected in a plurality of stages in a tree format, the frequency shift decimator circuits each comprising:
a selector configured to select one of input signals based on a signal output destination that is specified by a control signal, change an allocated band without interrupting communication of signals outside a band to be changed by avoiding the switching of output signals by the selector for a signal path in a band that is free from an effect of the band change and generate a plurality of output signals as many as an output signal number, which is greater than the number of input signals; and
a frequency decimation circuit, to which the plurality of output signals output from the selector are to be input, and which is configured to perform frequency conversion processing, low pass filter processing, and down-sampling processing on each of the signals input to the frequency decimation circuit, based on the signal output destination that is specified by the control signal and on a signal bandwidth, to generate an output signal,
wherein one of the frequency shift decimator circuits that is set in an M-th stage (1<M<N) out of N stages is configured so that the number of output signals is less than twice the number of input signals, and
wherein two or more reception signals are input to the multi-stage demultiplexing circuit, and the multi-stage demultiplexing circuit is configured to execute demultiplexing processing based on the control signal so that an output signal that includes an unused band portion is prevented from being output downstream.

2. The demultiplexing circuit according to claim 1, wherein the selector changes the allocated band without interrupting communication of signals outside the band to be changed, by executing, at each of the plurality of stages, based on the control signal, switching of output signals for a signal path in a band that is affected by the band change.

3. The demultiplexing circuit according to claim 2, wherein the frequency decimation circuit is configured to execute the low pass filter processing with a half-band filter.

4. The demultiplexing circuit according to claim 3, wherein the frequency decimation circuit is configured to execute the down-sampling processing so that a sampling rate is reduced to a half of a data rate of the input signal.

5. The demultiplexing circuit according to claim 2, wherein the frequency decimation circuit is configured to execute the down-sampling processing so that a sampling rate is reduced to a half of a data rate of the input signal.

6. The demultiplexing circuit according to claim 1, wherein the frequency decimation circuit is configured to execute the low pass filter processing with a half-band filter.

7. The demultiplexing circuit according to claim 6, wherein the frequency decimation circuit is configured to execute the down-sampling processing so that a sampling rate is reduced to a half of a data rate of the input signal.

8. The demultiplexing circuit according to claim 1, wherein the frequency decimation circuit is configured to execute the down-sampling processing so that a sampling rate is reduced to a half of a data rate of the input signal.

9. A channelizer relay unit, comprising:
the demultiplexing circuit of claim 1;
a multiplexing circuit, which is configured to multiplex a plurality of input signals, the multiplexing circuit comprising a multi-stage multiplexing circuit in which frequency interpolator circuits are connected in a plurality of stages in a tournament format, the frequency interpolator circuits each comprising:
a frequency interpolation circuit configured to generate an output signal by performing up-sampling processing, low pass filter processing, and frequency conversion processing on an input signal based on a signal output destination that is specified by a control signal and on a signal bandwidth, a selector, to which the output signal from each of a plurality of frequency interpolation circuits is to be input, and which is configured to generate an output signal destined to one or more output destinations for each input, based on the signal output destination that is specified by the control signal, and change an allocated band without interrupting communication of signals outside a band to be changed by avoiding the switching of output signals by the selector for a signal path in a band that is free from an effect of the band change, and an adder circuit configured to perform addition processing on two desired output signals in adjacent bands out of a plurality of output signals from the selector, wherein one of the frequency interpolator circuits that is set in an M-th stage (1<M<N) out of N stages is configured so that the number of input signals is less than twice the number of output signals, and a plurality of pre-multiplexing signals each including, at least partially, a used band are input to the multi-stage multiplexing circuit, and the multi-stage multiplexing circuit is configured to execute multiplexing processing based on the control signal so that an unused band portion is added downstream; and a control unit configured to execute processing of changing an allocated band by outputting the control signal to each of the demultiplexing circuit and the multiplexing circuit.

10. A multiplexing circuit, which is configured to multiplex a plurality of input signals, the multiplexing circuit comprising a multi-stage multiplexing circuit in which frequency interpolator circuits are connected in a plurality of stages in a tournament format, the frequency interpolator circuits each comprising:

a frequency interpolation circuit configured to generate an output signal by performing up-sampling processing, low pass filter processing, and frequency conversion processing on an input signal based on a signal output destination that is specified by a control signal and on a signal bandwidth;

a selector, to which the output signal from each of a plurality of frequency interpolation circuits is to be input, and which is configured to generate an output signal destined to one or more output destinations for each input, based on the signal output destination that is specified by the control signal, and change an allocated band without interrupting communication of signals outside a band to be changed by avoiding the switching of output signals by the selector for a signal path in a band that is free from an effect of the band change; and an adder circuit configured to perform addition processing on two desired output signals in adjacent bands out of a plurality of output signals from the selector, wherein one of the frequency interpolator circuits that is set in an M-th stage (1<M<N) out of N stages is configured so that the number of input signals is less than twice the number of output signals, and wherein a plurality of pre-multiplexing signals each including, at least partially, a used band are input to the multi-stage multiplexing circuit, and the multi-stage multiplexing circuit is configured to execute multiplexing processing based on the control signal so that an unused band portion is added downstream.

11. The multiplexing circuit according to claim 10, wherein the selector changes the allocated band without interrupting communication of signals outside the band to be changed, by executing, at each of the plurality of stages, based on the control signal, switching of signals for a signal path in a band that is affected by the band change.

12. The multiplexing circuit according to claim 11, wherein the frequency interpolation circuit is configured to execute the low pass filter processing with a half-band filter.

13. The multiplexing circuit according to claim 12, wherein the frequency interpolation circuit is configured to execute the up-sampling processing so that the input signal is interpolated at a sampling rate that is increased to a double of a data rate of the input signal.

14. The multiplexing circuit according to claim 11, wherein the frequency interpolation circuit is configured to execute the up-sampling processing so that the input signal is interpolated at a sampling rate that is increased to a double of a data rate of the input signal.

15. The multiplexing circuit according to claim 10, wherein the frequency interpolation circuit is configured to execute the low pass filter processing with a half-band filter.

16. The multiplexing circuit according to claim 15, wherein the frequency interpolation circuit is configured to execute the up-sampling processing so that the input signal is interpolated at a sampling rate that is increased to a double of a data rate of the input signal.

17. The multiplexing circuit according to claim 10, wherein the frequency interpolation circuit is configured to execute the up-sampling processing so that the input signal is interpolated at a sampling rate that is increased to a double of a data rate of the input signal.

* * * * *